(12) United States Patent
Hiramitsu et al.

(10) Patent No.: US 9,000,582 B2
(45) Date of Patent: Apr. 7, 2015

(54) POWER SEMICONDUCTOR MODULE AND POWER CONVERSION DEVICE

(75) Inventors: Shinji Hiramitsu, Kashiwa (JP); Atsushi Koshizaka, Hitachinaka (JP); Masato Higuma, Hitachinaka (JP); Hiroshi Tokuda, Hitachinaka (JP); Keiji Kawahara, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/979,595

(22) PCT Filed: Feb. 21, 2012

(86) PCT No.: PCT/JP2012/054129
§ 371 (c)(1),
(2), (4) Date: Jul. 12, 2013

(87) PCT Pub. No.: WO2012/117894
PCT Pub. Date: Sep. 7, 2012

(65) Prior Publication Data
US 2013/0328185 A1 Dec. 12, 2013

(30) Foreign Application Priority Data

Feb. 28, 2011 (JP) ................................ 2011-041112

(51) Int. Cl.
*H01L 23/24* (2006.01)
*H01L 21/52* (2006.01)
(Continued)

(52) U.S. Cl.
CPC ................ *H01L 23/34* (2013.01); *H01L 25/07* (2013.01); *H01L 25/18* (2013.01); *H02M 1/00* (2013.01);
(Continued)

(58) Field of Classification Search
USPC ............ 257/719, 712, E23.01, E21.002, 659, 257/738, 709, 699, 713, 717, 720, 675, 257/E23.141, E23.169, 140; 361/695, 688, 361/704, 679.54
See application file for complete search history.

(56) References Cited

U.S. PATENT DOCUMENTS

| 6,597,063 B1* | 7/2003 | Shimizu et al. ............... 257/687 |
| 2005/0117298 A1* | 6/2005 | Koga et al. .................... 361/699 |

(Continued)

FOREIGN PATENT DOCUMENTS

| JP | 2005-175163 A | 6/2005 |
| JP | 2010-110143 A | 5/2010 |

(Continued)

OTHER PUBLICATIONS

Corresponding International Search Report with English Translation dated May 29, 2012 (three (3) pages).

*Primary Examiner* — Alexander Oscar Williams
(74) *Attorney, Agent, or Firm* — Crowell & Moring LLP

(57) ABSTRACT

A power semiconductor module includes: a circuit body having a power semiconductor element and a conductor member connected to the power semiconductor element; a case in which the circuit body is housed; and a connecting member which connects the circuit body and the case. The case includes: a first heat dissipating member and a second heat dissipating member which are disposed in opposed relation to each other while interposing the circuit body in between; a side wall which joins the first heat dissipating member and the second heat dissipating member; and an intermediate member which is formed on the periphery of the first heat dissipating member and connected to the side wall, the intermediate member including a curvature that is projected toward a housing space of the case.

12 Claims, 33 Drawing Sheets

(51) Int. Cl.
*H01L 23/34* (2006.01)
*H01L 25/07* (2006.01)
*H01L 25/18* (2006.01)
*H02M 1/00* (2006.01)
*H02M 3/155* (2006.01)
*H02M 7/48* (2006.01)
*H01L 23/367* (2006.01)
*H01L 23/00* (2006.01)
*H02M 7/00* (2006.01)
*H01L 23/498* (2006.01)

(52) U.S. Cl.
CPC .............. *H02M 3/155* (2013.01); *H02M 7/003* (2013.01); *H02M 7/48* (2013.01); *H01L 23/3675* (2013.01); *H01L 24/33* (2013.01); *H01L 2924/13091* (2013.01); *H01L 2924/13055* (2013.01); *H01L 21/52* (2013.01); *H01L 23/49833* (2013.01); *H01L 2924/1306* (2013.01)

(56) References Cited

U.S. PATENT DOCUMENTS

| | | | |
|---|---|---|---|
| 2010/0037166 A1* | 2/2010 | Chandrasekar et al. | 715/769 |
| 2010/0238627 A1* | 9/2010 | Shinohara | 361/695 |
| 2010/0301496 A1* | 12/2010 | Koduri | 257/777 |
| 2011/0122574 A1* | 5/2011 | Tsunoda et al. | 361/679.54 |
| 2011/0299265 A1 | 12/2011 | Nakatsu et al. | |
| 2012/0001318 A1* | 1/2012 | Mamitsu et al. | 257/713 |
| 2012/0087095 A1 | 4/2012 | Tokuyama et al. | |
| 2013/0049041 A1* | 2/2013 | Ramer et al. | 257/98 |
| 2013/0130087 A1* | 5/2013 | Kawaguchi et al. | 429/120 |
| 2013/0140684 A1* | 6/2013 | Hauenstein | 257/659 |
| 2013/0224593 A1* | 8/2013 | Visco et al. | 429/218.1 |
| 2013/0267064 A1* | 10/2013 | Ikeda et al. | 438/109 |
| 2014/0117408 A1* | 5/2014 | Kim et al. | 257/140 |

FOREIGN PATENT DOCUMENTS

| | | |
|---|---|---|
| JP | 2010-258315 A | 11/2010 |
| JP | 2013211942 A * | 10/2013 |

* cited by examiner

FIG. 3
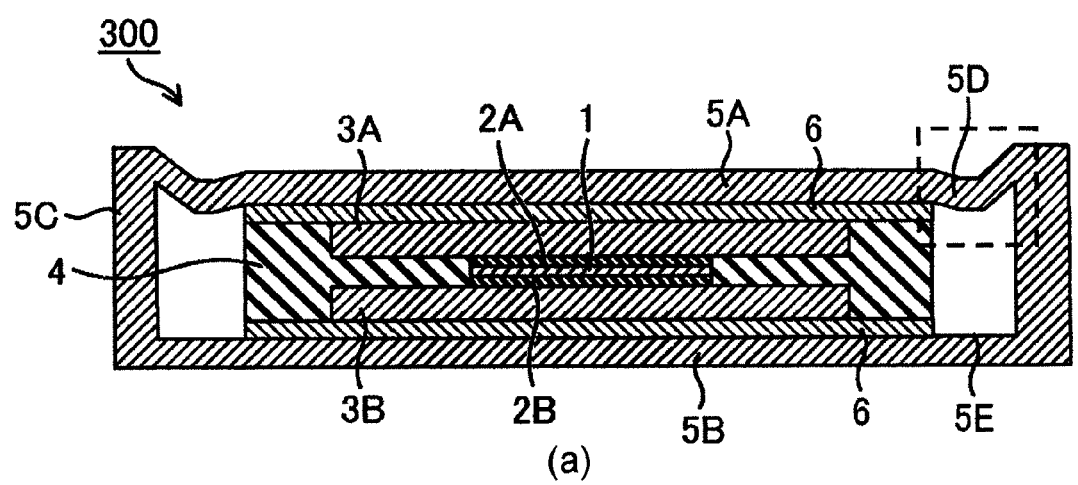
(a)
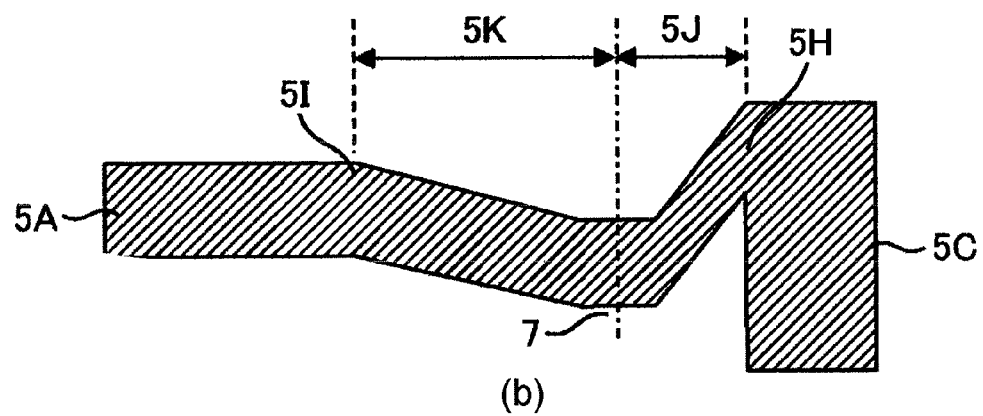
(b)

FIG. 5
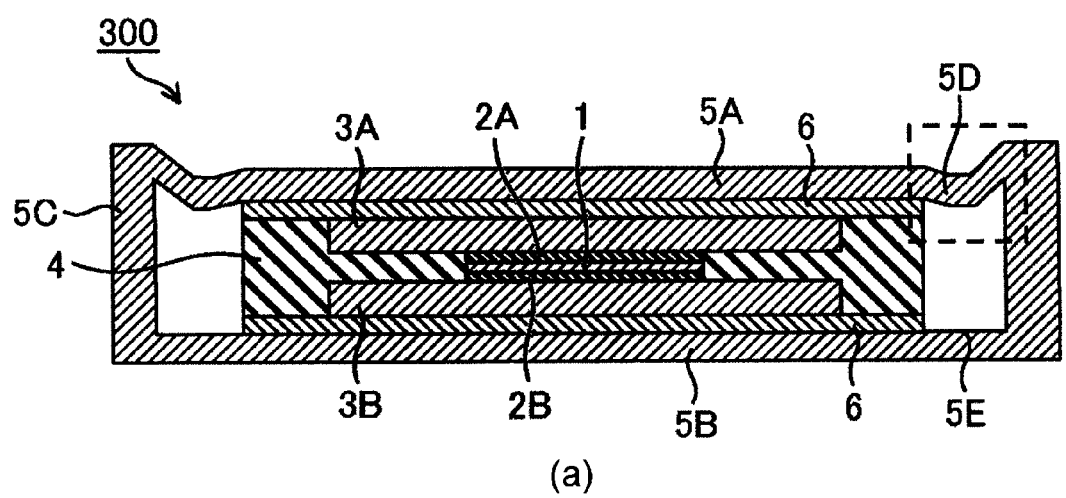
(a)
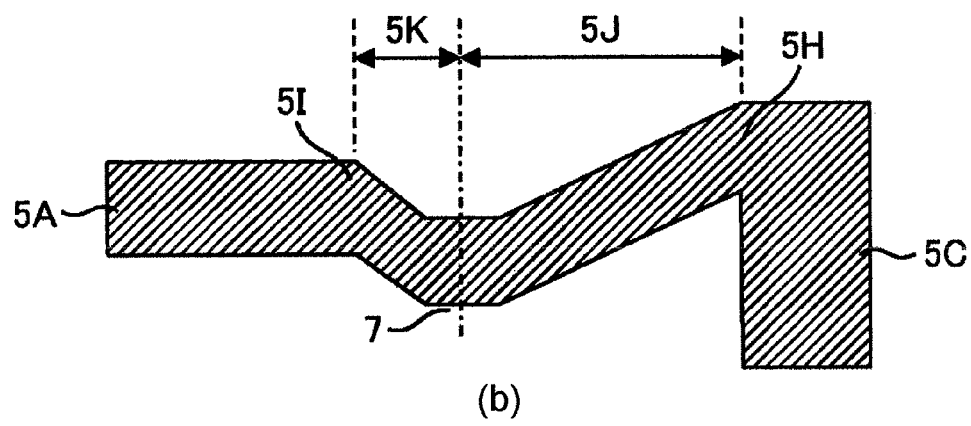
(b)

FIG. 7
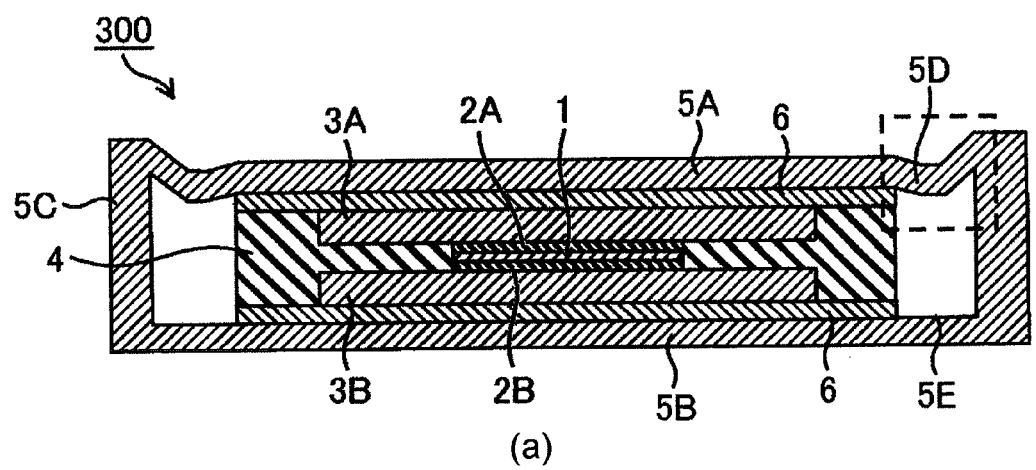
(a)
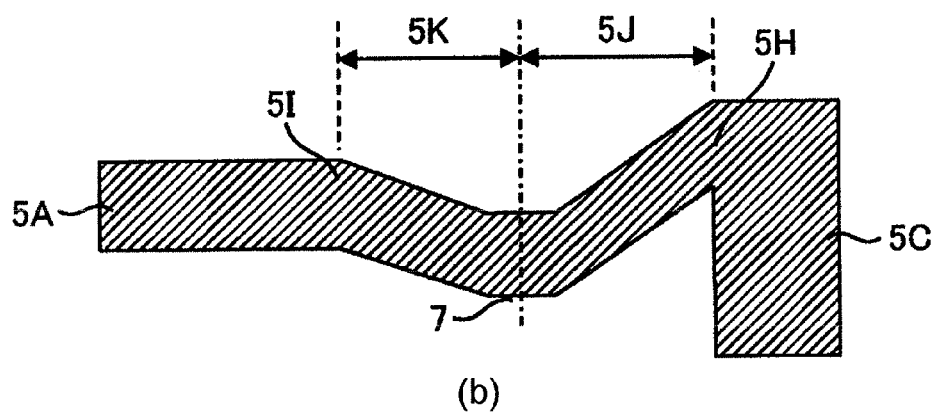
(b)

FIG. 13

| ALLOY | COMPOSITION (wt%) | SOLIDUS TEMPERATURE (°C) | LIQUIDUS TEMPERATURE (°C) |
|---|---|---|---|
| Sn-Pb BASED | Sn-5Pb | 183 | 224 |
| | Sn-35Pb | 183 | 186 |
| | Sn-37Pb | 183 | 184 |
| | Sn-40Pb | 183 | 190 |
| | Sn-45Pb | 183 | 203 |
| | Sn-50Pb | 183 | 215 |
| Pb-Sn BASED | Sn-55Pb | 183 | 227 |
| | Sn-60Pb | 183 | 238 |
| | Sn-65Pb | 183 | 248 |
| | Sn-70Pb | 183 | 258 |
| | Sn-80Pb | 183 | 279 |
| | Sn-90Pb | 268 | 301 |
| | Sn-95Pb | 300 | 314 |
| | Sn-98Pb | 316 | 322 |
| Sn-Pb-Bi BASED | Sn-43Pb-14Bi | 135 | 165 |
| Sn-Bi BASED | Sn-58Bi | 139 | 139 |
| Sn-Pb-Ag BASED | Sn-36Pb-2Ag | 179 | 190 |
| Sn-Ag BASED | Sn-3.5Ag | 221 | 221 |
| Sn-Sb BASED | Sn-5Sb | 235 | 240 |
| Pb-Ag BASED | Pb-2.5Ag | 304 | 304 |
| Pb-Ag-Sn BASED | Pb-1.5Ag-1Sn | 309 | 309 |

(a)    (b)

POWER SEMICONDUCTOR MODULE AND POWER CONVERSION DEVICE

TECHNICAL FIELD

The present invention relates to a power semiconductor module including a power semiconductor element that performs a switching operation to convert DC power into AC power or AC power into DC power, a method of manufacturing the power semiconductor module, and a power conversion device.

BACKGROUND ART

A power conversion device has a function to either convert DC power supplied from a DC power source into AC power to be supplied to an alternating current consumer such as a rotary electric machine, or convert AC power generated by the rotary electric machine into DC power to be supplied to the DC power source. In order to achieve such conversion function, the power conversion device includes a power semiconductor device having a power semiconductor element that performs a switching operation, where power is converted from DC power into AC power or from AC power into DC power by the power semiconductor element which repeats conducting and interrupting operations.

The aforementioned power semiconductor device is provided with a positive terminal and a negative terminal to supply DC power to the power semiconductor element. PTL 1 discloses a power semiconductor device in which a power semiconductor element is sealed with a resin material and housed in a can-like case while the positive and the negative terminals are laminated.

The power semiconductor device is required to radiate heat to the outside by way of a heat dissipating member, the heat being generated by the power semiconductor element when conducting electricity. Accordingly, when a circuit body including the power semiconductor element and a conductor member connected to the power semiconductor element is inserted into a case integrated with the heat dissipating member, it is required for the both members to be securely connected via a connecting member in order to secure a heat dissipating path. It is however concerned that, when excessive residual stress is generated in the connecting member in housing and connecting the circuit body in/to the case, the connecting member may crack on the inside or the member may be detached from a connection interface. These crack in the connecting portion and the detachment lead to the decrease in heat dissipating performance of the power semiconductor device and the breakage thereof. This means that reliability of the power semiconductor device can possibly be impaired to a great extent.

CITATION LIST

Patent Literature

PTL 1: JP 2010-110143 A

SUMMARY OF INVENTION

Technical Problem

An object of the present invention is to improve the reliability of the power semiconductor device, namely, the power semiconductor module, and the power conversion device using the same.

Solution to Problem

According to a first aspect of the invention, there is provided a power semiconductor module including: a circuit body including a power semiconductor element and a conductor member connected to the power semiconductor element; a case in which the circuit body is housed; and a connecting member which connects the circuit body. The case includes: a first heat dissipating member and a second heat dissipating member which are disposed in opposed relation to each other while interposing the circuit body in between; a side wall which joins the first heat dissipating member and the second heat dissipating member; and an intermediate member which is formed on a periphery of the first heat dissipating member and connected to the side wall, and the intermediate member including a curvature that is projected toward a housing space of the case.

According to a second aspect of the invention, in the power semiconductor module according to the first aspect, it is preferable that, when a connecting portion between the side wall and the intermediate member is defined as a first connecting portion while a connecting portion between the first heat dissipating member and the intermediate member is defined as a second connecting portion, a protrusion formed in the intermediate member is projected toward a side where the circuit body is disposed relative to a position of a line segment connecting the first connecting portion and the second connecting portion.

According to a third aspect of the invention, in the power semiconductor module according to the second aspect, it is preferable that an apex of the protrusion is formed at a midpoint of the line segment connecting the first connecting portion and the second connecting portion.

According to a fourth aspect of the invention, in the power semiconductor module according to the second aspect, it is preferable that the apex of the protrusion is formed closer to the first connecting portion than the midpoint of the line segment connecting the first connecting portion and the second connecting portion.

According to a fifth aspect of the invention, in the power semiconductor module according to the second aspect, it is preferable that the apex of the protrusion is formed closer to the second connecting portion than the midpoint of the line segment connecting the first connecting portion and the second connecting portion.

According to a sixth aspect of the invention, in the power semiconductor module according to the second aspect, it is preferable that the second connecting portion is a corner of the first heat dissipating member, and the first connecting portion is a corner of the intermediate member.

According to a seventh aspect of the invention, in the power semiconductor module according to the sixth aspect, when projected from a heat dissipating surface of the first heat dissipating member, it is preferable that a projected part of the protrusion formed in the intermediate member has a shape that is bent along two adjacent sides of the first heat dissipating member which form a corner of the second connecting portion.

According to an eighth aspect of the invention, in the power semiconductor module according to the first aspect, it is preferable that the curvature in the intermediate member is plastically deformed.

According to a ninth aspect of the invention, there is provided a method of manufacturing a power semiconductor module, and the power semiconductor module includes: a circuit body including semiconductor element, and a conductor plate connected to an electrode plane of the semiconductor element through solder; and a metal case including a first heat dissipating plate facing one surface of the circuit body, a second heat dissipating plate facing another surface of the circuit body opposite to the one surface thereof, and an intermediate member which connects the first heat dissipating plate and the second heat dissipating plate and includes an opening into which the circuit body is inserted. The method includes: a first step of inserting the circuit body from the opening of the case; a second step of deforming a part of the intermediate member of the case while holding the circuit body between the first heat dissipating plate and the second heat dissipating plate; a third step of further deforming a part of the intermediate member of the case; and a fourth step of performing high-temperature treatment on the case and the circuit body.

According to a tenth aspect of the invention, in the method of manufacturing a power semiconductor module according to the ninth aspect, it is preferable that the power semiconductor module includes an insulating sheet which joins at least one of the first heat dissipating plate and the second heat dissipating plate with the circuit body, and an adhesive force of the sheet is increased by the high-temperature treatment performed in the fourth step.

According to an eleventh aspect of the invention, there is provided a power conversion device including: a power semiconductor module including a power semiconductor element which converts DC current into AC current; and a passage forming body which forms a passage through which a cooling medium that cools the power semiconductor element flows. The power semiconductor module includes a circuit body having a conductor member connected to the power semiconductor element, a case in which the circuit body is housed, and a connecting member which connects the circuit body and the case. The case includes: a first heat dissipating member and a second heat dissipating member which are disposed in opposed relation to each other while interposing the circuit body in between; a side wall which joins the first heat dissipating member and the second heat dissipating member; and an intermediate member which is formed on a periphery of the first heat dissipating member and connected to the side wall, the intermediate member including a curvature that is projected toward a housing space of the case, and the case is fixed to the passage forming body in order for the first heat dissipating member and the second heat dissipating member to be indirect contact with the cooling medium.

According to a twelfth aspect of the invention, in the power semiconductor module according to the first aspect, it is preferable that the first heat dissipating member and the intermediate member are formed when a part corresponding to the first heat dissipating member on a flat planar member of the case is pressed toward the housing space of the case.

Advantageous Effects of Invention

According to the present invention, the reliability of the power semiconductor module and the power conversion device using the same can be improved.

BRIEF DESCRIPTION OF DRAWINGS

FIGS. 1(a) to 1(c) are diagrams illustrating a power semiconductor module according to a first embodiment of the present invention, where FIGS. 1(a) and 1(b) are perspective views of the module, and FIG. 1(c) is a cross-sectional view of the module.

FIGS. 2(a) to 2(e) are a set of diagrams illustrating an assembly process of the power semiconductor module according to the first embodiment of the present invention.

[FIG. 3] FIGS. 3(a) and 3(b) are cross-sectional views illustrating a first modified example of a case 5 of the power semiconductor module according to the first embodiment of the present invention, where FIG. 3(a) is a general view of the case, and FIG. 3(b) is an enlarged view of an intermediate member 5D of the case 5.

FIG. 4 is a graph illustrating a relationship between a distance from a central position of the intermediate member 5D in a width direction to a protrusion apex 7 and stress generated in a joint member 6 during a third assembly process.

[FIG. 5] FIGS. 5(a) and 5(b) are cross-sectional views illustrating a second modified example of a case of a power semiconductor module according to another embodiment of the present invention, where FIG. 5(a) is a general view of the case, and FIG. 5(b) is an enlarged view of an intermediate member 5D of the case 5.

FIG. 6 is a graph illustrating a relationship between a distance from a central position of the intermediate member 5D in a width direction to a protrusion apex 7 and stress generated in a side wall 5C during a third process illustrated in FIGS. 2(a) to 2(e).

[FIG. 7] FIGS. 7(a) and 7(b) are cross-sectional views illustrating a third modified example of a case 5 of a power semiconductor module according to another embodiment of the present invention, where FIG. 7(a) is a general view of the case, and FIG. 7(b) is an enlarged view of an intermediate member 5D of the case 5.

FIGS. 8(a) to 8(c) are diagrams illustrating an arrangement of a deformed protrusion region 5F in the intermediate member 5D of the case 5 in order to gain an effect of reducing residual stress in the joint member 6.

FIG. 9 is a diagram illustrating a result of a finite element analysis in which a second assembly process is simulated and, namely, illustrating a distribution of tensile force generated in the joint member 6 in a direction perpendicular to a joint surface.

FIG. 10 is a cross-sectional view of a power semiconductor module according to a second embodiment of the present invention.

FIG. 11 is a cross-sectional view of a power semiconductor module according to a third embodiment of the present invention.

FIGS. 12(a) to 12(d) are a set of diagrams illustrating an assembly process of a power semiconductor module 300 according to a fourth embodiment of the present invention.

[FIG. 13] FIG. 13 is a table illustrating a melting point of a general solder alloy.

FIG. 14 is a graph illustrating a relationship between a restoring amount (a spring back amount) of a case 5 and a temperature at that time, the spring back amount being generated when pressure on the case 5 is released after a member simulating a circuit body 100 is inserted into the case 5 so that the case is pressurized and deformed.

FIG. 15 is a systematic diagram illustrating a hybrid vehicle system.

FIG. 16 is a schematic diagram illustrating a configuration of an electric circuit illustrated in FIG. 15.

FIG. 17 is an exterior perspective view of a power conversion device 200 according to an embodiment of the present invention.

FIG. 18 is an exterior perspective view of a power conversion device 200 according to an embodiment of the present invention.

FIG. 19 is a diagram illustrating the power conversion device 200 in FIG. 18 from which a cover 8, a DC interface 137, and an AC interface 185 are removed.

FIG. 20 is a diagram in which a housing 10 is removed from a passage forming body 12 illustrated in FIG. 19.

FIG. 21 is an exploded perspective view of the power conversion device 200.

FIG. 22 is an exterior perspective view of the passage forming body 12 to which power modules 300U to 300W, a capacitor module 500, and a busbar assembly 800 are assembled.

FIG. 23 is a diagram illustrating the passage forming body 12 from which the bulbar assembly 800 is removed.

FIG. 24 is a perspective view of the passage forming body 12.

FIG. 25 is an exploded perspective view of the passage forming body 12 seen from a back side.

FIG. 26(a) is a perspective view of the power module 300U according to the present embodiment, while FIG. 26(b) is a cross-sectional view of the power module 300U cut along cross section D and seen from direction E according to the present embodiment.

FIG. 27(a) is a perspective view of the power module 300U, FIG. 27(b) is a cross-sectional view of the power module cut along cross section D and seen from direction E similarly to FIG. 26(b), and FIG. 27(c) is a cross-sectional view of the power module before a curvature 304A is deformed by pressure applied to a fin 305.

FIG. 28(a) is a perspective view of the power module 300U, while FIG. 28(b) is a cross-sectional view of the power module cut along cross section D and seen from direction E in a similar manner to that in FIGS. 26(b) and 27(b).

FIG. 29 is a perspective view of the power module 300U in FIG. 28 from which a first sealing resin 348 and a wiring insulation part 608 are further removed.

FIG. 30 is a diagram illustrating an assembly process of a primary module sealed body 302.

FIG. 31 is an exterior perspective view of the capacitor module 500.

FIG. 32 is a perspective view of the busbar assembly 800.

FIG. 33 is a diagram illustrating the passage forming body 12 in which the power modules 300U to 300W are fixed in openings 402a to 402c, and the capacitor module 500 is housed in a housing space 405.

DESCRIPTION OF EMBODIMENTS

Embodiments will now be described with reference to the drawings.

First Embodiment

Figure 1:
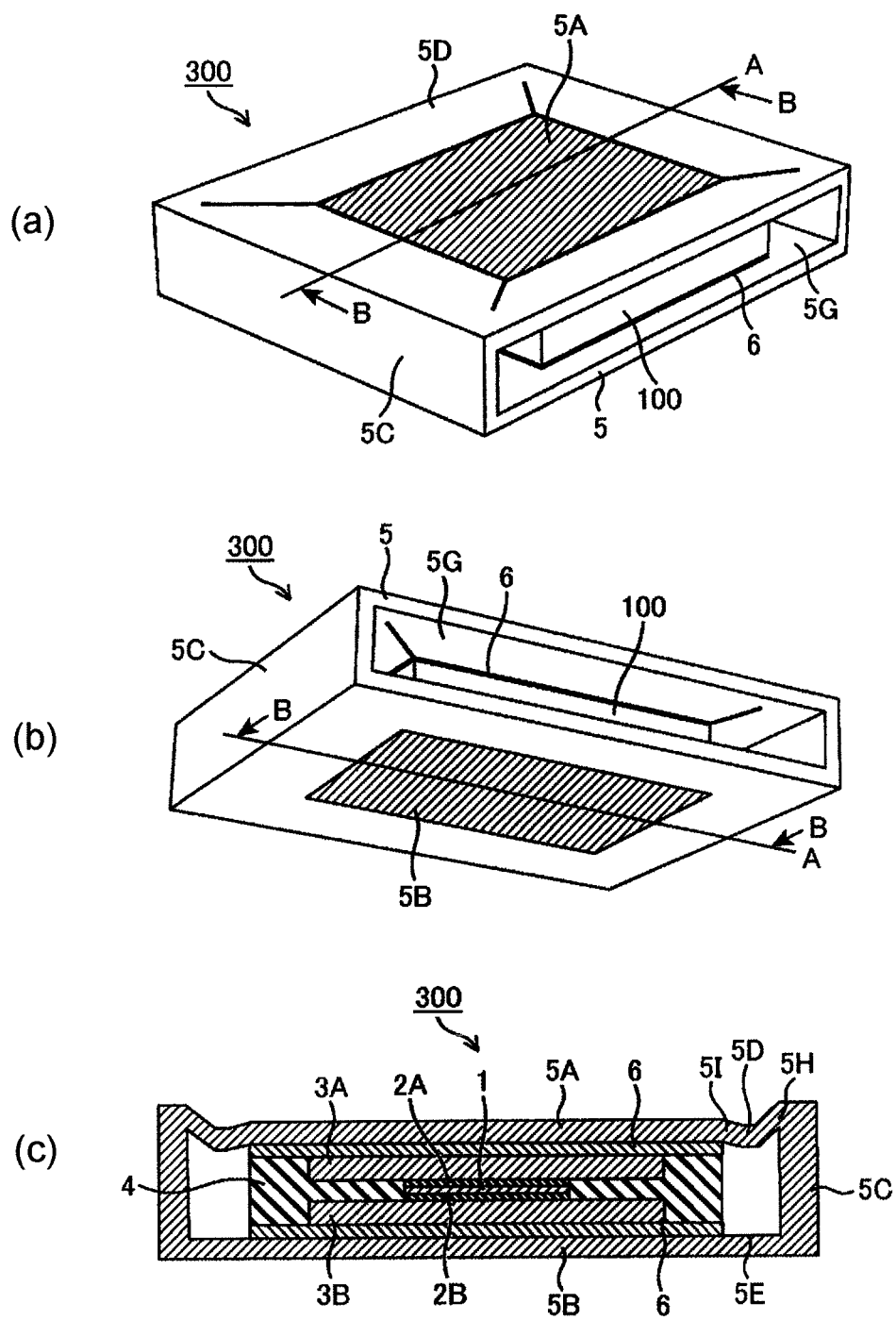
[FIG. 1]

FIG. 1(a) is a perspective view of one side of a power semiconductor module (a power semiconductor device) 300 according to a first embodiment of the present invention, FIG. 1(b) is a perspective view of another side of the power semiconductor module 300, and FIG. 1(c) is a cross-sectional view of the power semiconductor module 300 cut along cross section A and seen from direction B as illustrated in FIGS. 1(a) and 1(b).

As illustrated in FIGS. 1(a) and 1(b), the power semiconductor module 300 includes a case 5 housing a circuit body 100 in which a semiconductor element 1 to be described is built in. The case 5 is formed into a rectangular parallelepiped including a first heat dissipating member 5A and a second heat dissipating member 5B, each of which forms the largest surface, and a side wall 5C which forms a side surface. An opening 5G from which the circuit body 100 is inserted is formed on one surface of the plurality of side surfaces of the case 5. The first heat dissipating member 5A and the second heat dissipating member 5B are formed facing each other through the circuit body 100. An intermediate member 5D is disposed to surround the first heat dissipating member 5A and connects the first heat dissipating member 5A and the side wall 5C. Likewise, an intermediate member 5E is disposed to surround the second heat dissipating member 5B and connects the second heat dissipating member 5B and the side wall 5C. The case 5 is formed of Al, an Al alloy, Cu, a Cu alloy or the like having high thermal conductivity.

A joint member 6 is disposed between the inner wall of the case 5 and the circuit body 100. The joint member 6 is formed of a resin member having high adhesiveness and insulation, for example, and preferably formed of an insulating sheet having high adhesiveness and insulation. Here, the joint member 6 may also be formed of a solder alloy, a low-temperature sintered joint material containing a fine metal particle, or a conductive adhesive containing a fine metal particle, in which case an insulating member need be inserted between the circuit body 100 and the case 5 to be joined together, the insulating member being a ceramic member formed of aluminum nitride, alumina, or silicon nitride, or a laminate of ceramic and metal, for example.

As illustrated in FIG. 1(c), the circuit body 100 includes: the semiconductor element 1; a conductor plate 3A which is connected to one electrode plane of the semiconductor element 1 by way of a joint member 2A; a conductor plate 3B which is connected to another electrode plane of the semiconductor element 1 by way of a joint member 2B; and a sealant 4 which seals the semiconductor element 1, the conductor plate 3A, and the conductor plate 3B together. The sealant 4 is formed such that each of the conductor plates 3A and 3B has an exposed surface on the side opposite to where the semiconductor element 1 is disposed. The semiconductor element 1 is formed of Si, SiC, or GaN, for example. The joint members 2A and 2B are formed of a solder alloy, a low-temperature sintered joint material containing a fine metal particle, or a conductive adhesive containing a fine metal particle, for example. The conductor plates 3A and 3B are formed of Cu, a Cu alloy, Al, or an Al alloy having high electrical conductivity and thermal conductivity, for example.

Formed in the intermediate member 5D of the case 5 is a curvature that protrudes toward a housing space of the case 5. That is, when a connection between the side wall 5C and the intermediate member 5D is defined as a first connecting portion 5H while a connection between the first heat dissipating member 5A and the intermediate member 5D is defined as a second connecting portion 5I, the protrusion formed in the intermediate member 5D is projected toward the side where the circuit body 100 is disposed relative to the position of a line segment connecting the first connecting portion 5H and the second connecting portion 5I.

FIGS. 2(a) to 2(e) are a set of diagrams illustrating an assembly process of the power semiconductor module 300 according to the present embodiment.

In a first assembly process illustrated in FIG. 2(a), the circuit body 100, to which the joint member 6 is attached, is inserted into the case 5 from the opening 5G. Here, the joint member 6 is preferably fixed to the entire or a part of a surface of the circuit body 100 by metal joining, bonding, or coating, for example, such that the both sides will not be out of alignment.

Figure 2:
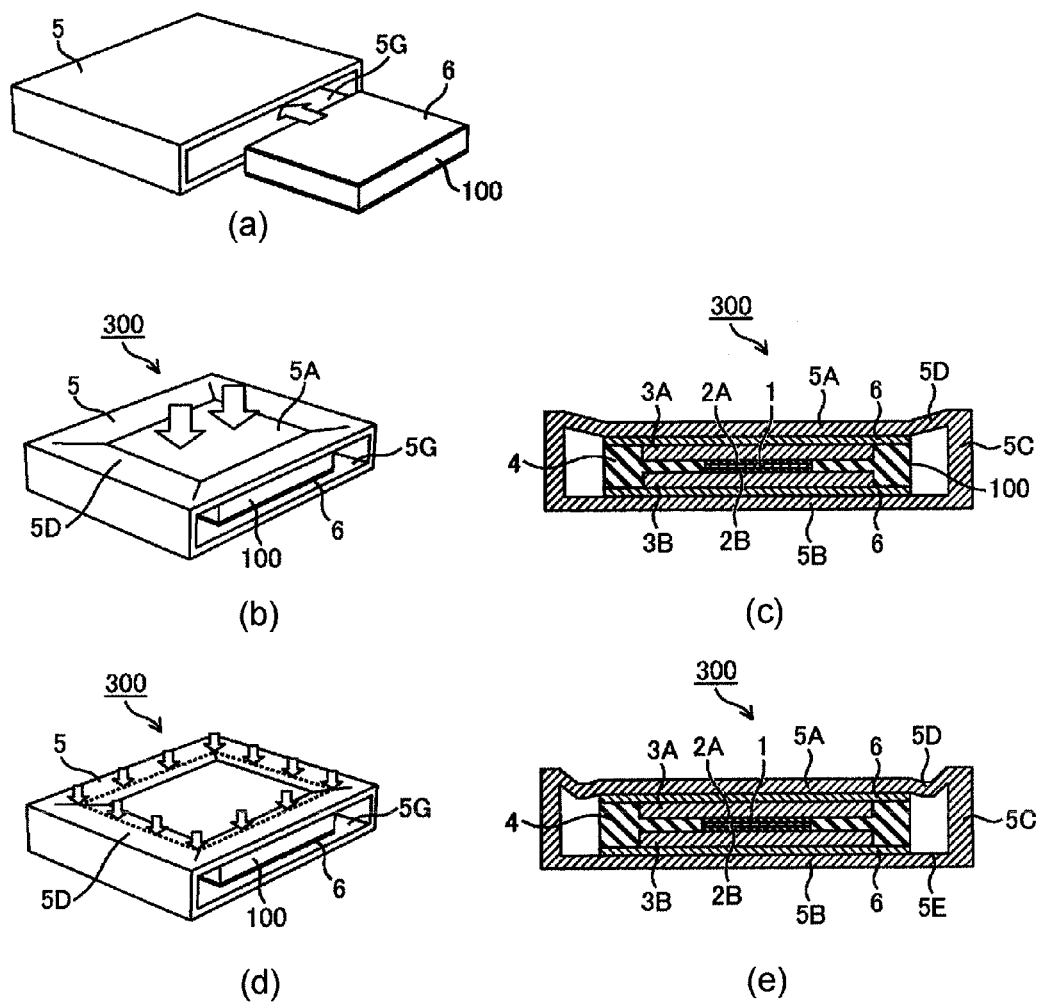
[FIG. 2]

In a second assembly process illustrated in FIG. 2(*b*), a pressing force is applied to the surface of the first heat dissipating member 5A in a direction substantially perpendicular to the surface, whereby the intermediate member 5D is deformed so that the joint member 6 and the inner wall of the case 5 come in close contact with each other. That is, the first heat dissipating member 5A and the intermediate member 5D are formed when a part of a planar member of the case 5 corresponding to the first heat dissipating member 5A is pressed down. The pressing force applied to the first heat dissipating member 5A enhances the adhesion between the joint member 6 and the circuit body 100 as well. At this time, however, the deformation of the intermediate member 5D gives rise to a reaction force which acts in a direction of pulling the first heat dissipating member 5A toward the side opposite to where the circuit body 100 is disposed. This causes the residual stress to be applied to the joint member 6, the residual stress pulling the first heat dissipating member 5A toward the side opposite to where the circuit body 100 is disposed. FIG. 2(*c*) is a cross-sectional view of the power semiconductor module 300 after the second assembly process has been completed.

In a third assembly process illustrated in FIG. 2(*d*), a curvature protruding toward the housing space of the case 5 is formed by deforming the intermediate member 5D of the case 5. This protrusion can reduce the reaction force generated in the intermediate member 5D during the second assembly process, because the reaction force of the deformation of the intermediate member 5D projected toward the housing space acts in a direction of pushing the first heat dissipating member 5A down to the side of the circuit body 100. Note that the reaction force can be sufficiently reduced by subjecting the protrusion of the intermediate member 5D to plastic deformation. FIG. 2(*e*) is a cross-sectional view of the power semiconductor module 300 after the third assembly process has been completed.

FIG. 3(*a*) is a cross-sectional view of the power semiconductor module 300 according to the present embodiment while FIG. 3(*b*) is an enlarged view of a portion enclosed with a dotted line in FIG. 3(*a*). Here, an apex of the protrusion formed in the intermediate member 5D is defined as a protrusion apex 7. In addition, a distance between the first connecting portion 5H and the protrusion apex 7 measured in a direction parallel to a heat dissipating surface of the first heat dissipating member 5A is defined as 5J, whereas a distance between the second connecting portion 5I and the protrusion apex 7 that are projected on a surface parallel to the first heat dissipating member 5A is defined as 5K. The protrusion of the intermediate member 5D in the present embodiment illustrated in FIG. 3(*b*) is formed such that the distance 5K is greater than the distance 5J.

Figure 4:
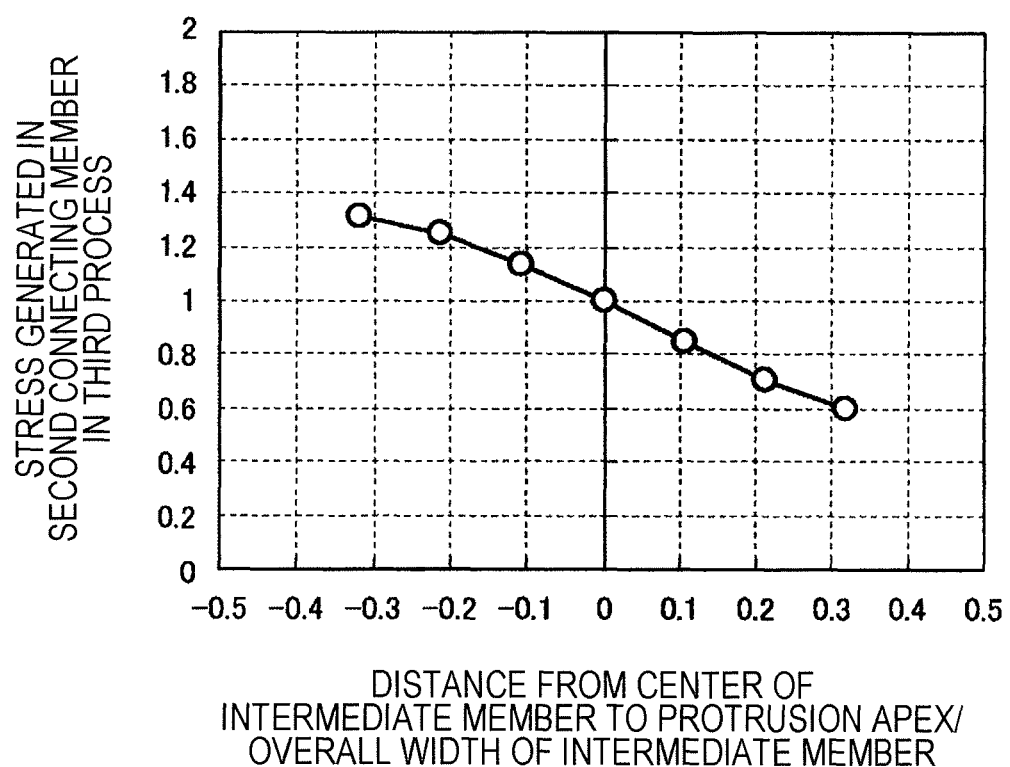
[FIG. 4]

FIG. 4 is a graph illustrating a relationship between a distance from a center of the intermediate member 5D in the width direction (between the first connecting portion 5H and the second connecting portion 5I) to the protrusion apex 7, and the stress in the joint member 6 generated after the third assembly process has been completed.

When the distance from the center of the intermediate member 5D in the width direction to the protrusion apex 7 is zero, the protrusion apex 7 is formed at the center of the intermediate member 5D. When the distance from the center of the intermediate member 5D in the width direction to the protrusion apex 7 is on a negative side, the protrusion apex 7 is formed closer to the first heat dissipating member 5A.

When the distance from the center of the intermediate member 5D in the width direction to the protrusion apex 7 is on a positive side, the protrusion apex 7 is formed closer to the side wall 5C.

Note that the stress value in the joint member reflects the result of a finite element analysis simulating the third assembly process and is normalized on the basis of the stress value when the distance from the center of the intermediate member 5D in the width direction to the protrusion apex 7 is zero.

According to the graph, the stress generated in the joint member 6 during the third process decreases as the protrusion apex 7 is formed closer to the side wall 5C. Therefore, as illustrated in the embodiment in FIGS. 3(*a*) and 3(*b*), damage to the joint member 6 and the circuit body 100 can be suppressed by forming the protrusion of the intermediate member 5D such that the distance 5K is greater than the distance 5J.

FIG. 5(*a*) is a cross-sectional view of a power semiconductor module 300 according to another embodiment, whereas FIG. 5(*b*) is an enlarged view of a portion enclosed with a dotted line in FIG. 5(*a*). The protrusion of an intermediate member 5D of the embodiment illustrated in FIG. 5(*b*) is formed such that a distance 5J is greater than a distance 5K.

Figure 6:
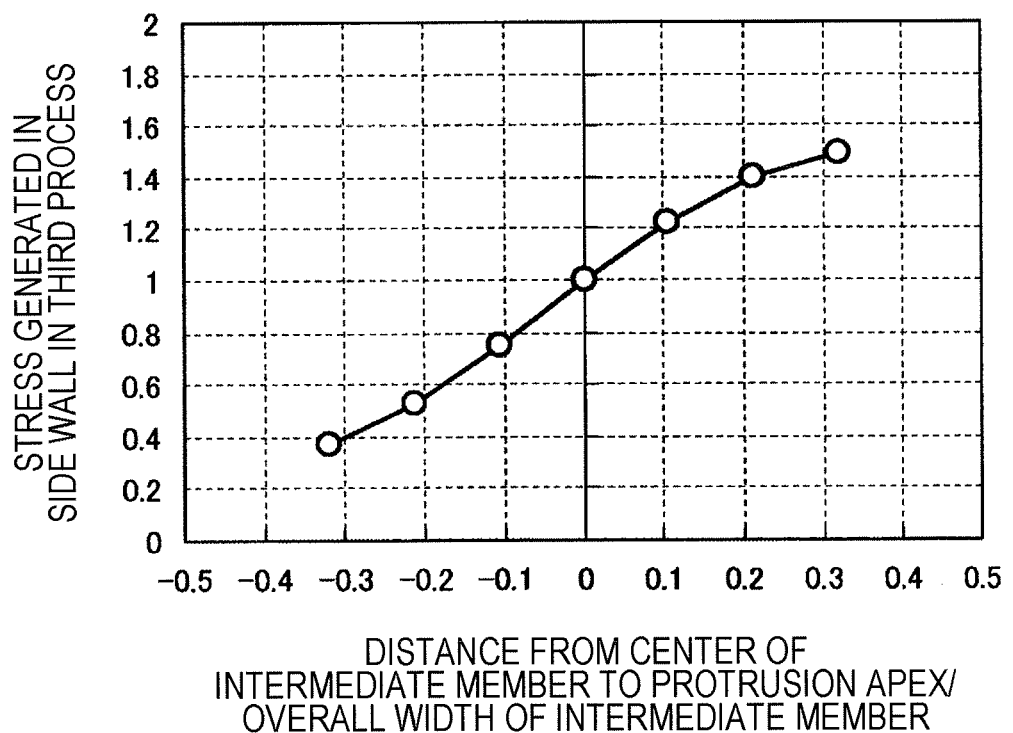
[FIG. 6]

FIG. 6 is a graph illustrating a relationship between a distance from the center of the intermediate member 5D in the width direction to a protrusion apex 7, and the stress generated in a side wall 5C in the third process illustrated in FIGS. 2(*a*) to 2(*e*). As with FIG. 4, FIG. 6 is a graph illustrating a relationship between the distance from the center of the intermediate member 5D in the width direction (between a first connecting portion 5H and a second connecting portion 5I) to the protrusion apex 7, and the stress generated in a joint member 6 after the third assembly process has been completed. The vertical axis, the horizontal axis, and the analysis method in FIG. 6 are similar to those of FIG. 4.

According to the graph, the stress generated in the side wall 5C during the third process decreases as the protrusion apex 7 is formed closer to a first heat dissipating member 5A. Therefore, as illustrated in the embodiment in FIG. 5, damage to the side wall 5C can be prevented by forming the protrusion of the intermediate member 5D such that the distance 5J is greater than the distance 5K.

FIG. 7(*a*) is a cross-sectional view of a power semiconductor module 300 according to another embodiment, whereas FIG. 7(*b*) is an enlarged view of a portion enclosed with a dotted line in FIG. 7(*a*). A protrusion apex 7 in the embodiment illustrated in FIG. 7(*b*) is formed at the center of an intermediate member 5D, whereby a distance 5J is equal to a distance 5K. This allows the stress generated in both a joint member 6 and a side wall 5C after a third assembly process to be reduced in a balanced manner.

Each embodiment illustrated in FIGS. 3, 5, and 7 may be selected as appropriate according to the area in which the stress is to be reduced or the shape of a case 5 in order to suppress damage to the power semiconductor module 300.

Figure 8:
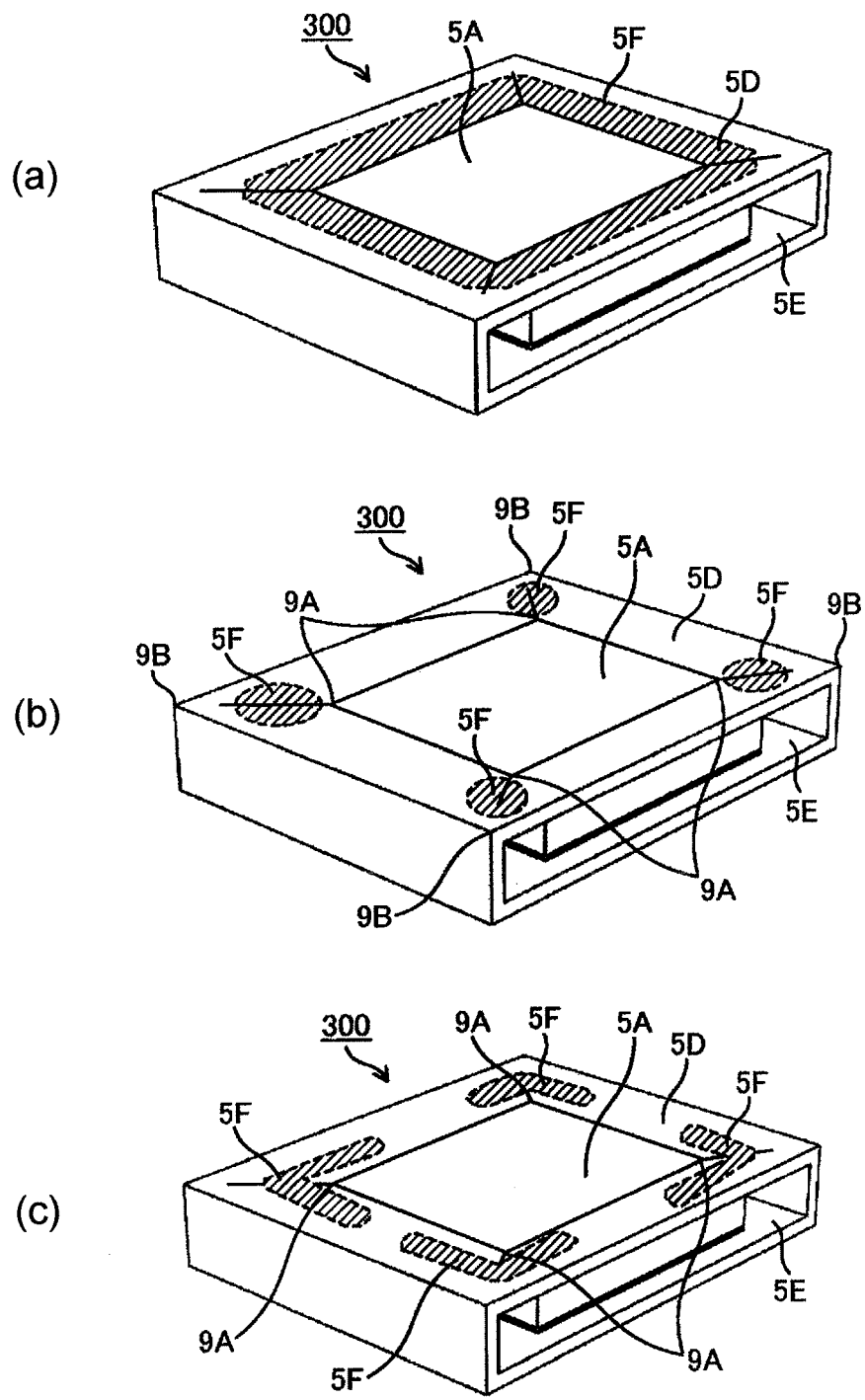
[FIG. 8]
Figure 9:
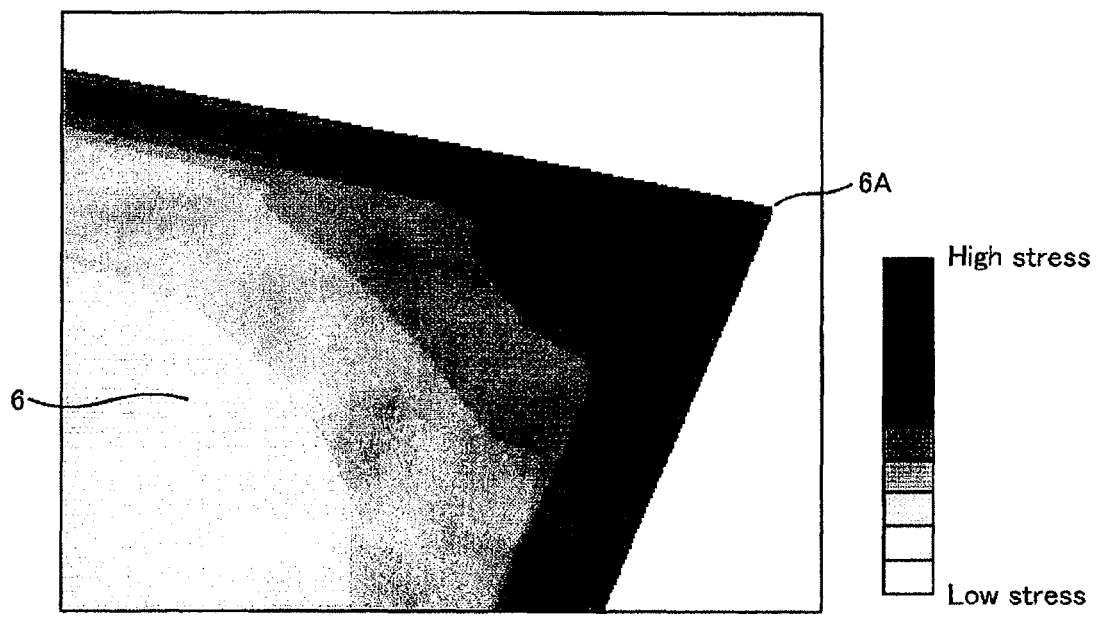
[FIG. 9]

FIGS. 8(*a*) to 8(*c*) are diagrams illustrating the arrangement of a deformed protrusion region 5F in the intermediate member 5D of the case 5 in order to reduce the residual stress in the joint member 6. FIG. 9 is a diagram illustrating the result of a finite element analysis simulating a tensile stress in the joint member 6 after the second assembly process.

As is understood from FIG. 9, the maximum tensile stress is generated at a corner 6A of the joint member 6 after the second assembly process has been completed. In terms of the distribution of the in-plane tensile stress in the joint member 6, it can be understood that the larger tensile force is distributed toward the edge of the surface of the joint member 6 relative to the center thereof, namely, toward the side of the joint member 6. In terms of the distribution of the tensile stress on the side of the joint member 6, it can be understood that the tensile force becomes larger toward the corner 6A of the joint member 6.

In the power semiconductor module 300 illustrated in FIG. 8(*a*), the deformed protrusion region 5F is formed while surrounding the first heat dissipating member 5A that faces the joint member 6. Since the deformed protrusion region 5F surrounds the entire area around the side of the joint member 6 where there is relatively high tensile stress, the effect of reducing the residual stress can be maximized.

On the other hand, a case where the deformed protrusion region 5F is partially formed in the power semiconductor module 300 illustrated in FIGS. 8(*b*) and 8(*c*) well be described.

As illustrated in FIG. 8(*b*), the corner of the first heat dissipating member 5A is defined as a corner 9A whereas the corner of the case 5 is defined as a corner 9B. The deformed protrusion region 5F in FIG. 8(*b*) is formed to overlap with a line segment connecting the corners 9A and 9B. That is, when projected from a direction perpendicular to the heat dissipating surface of the first heat dissipating member 5A, the projected part of the deformed protrusion region 5F overlaps with the line segment connecting the corners 9A and 9B. Note that the shape of the first heat dissipating member 5A is substantially identical or similar to that of the joint member 6, meaning that the corner 9A of the first heat dissipating member 5A overlaps with or is disposed close to the corner 6A of the joint member 6. As a result, the residual stress at the corner 6A of the joint member 6 where the tensile stress is relatively large, as illustrated in FIG. 9, can be reduced while keeping the deformation of the intermediate member 5D to the minimum. The distortion or breakage of the case 5 can thus be suppressed. Note that the corner 9B can also be a corner of the intermediate member 5D.

The deformed protrusion region 5F illustrated in FIG. 8(*c*) is substantially L-shaped around the corner 9A of the first heat dissipating member 5A. That is, when projected from the heat dissipating surface of the first heat dissipating member 5A, the projected part of the deformed protrusion region 5F has the shape that is bent along two adjacent sides of the first heat dissipating member 5A forming the corner 9A of the first heat dissipating member 5A. Note that, as with FIG. 8(*b*), the shape of the first heat dissipating member 5A is substantially identical or similar to that of the joint member 6, meaning that the corner 9A of the first heat dissipating member 5A overlaps with or is disposed close to the corner 6A of the joint member 6. As a result, the amount of deformation of the intermediate member 5D can be balanced with the effect of reducing the residual stress.

Second Embodiment

Figure 10:
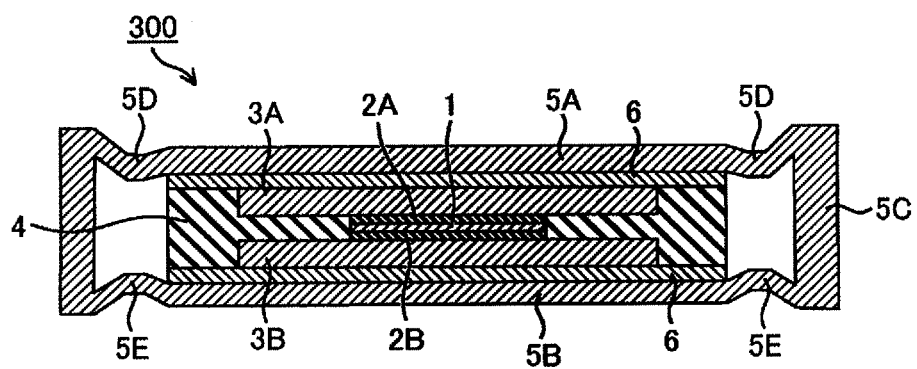
[FIG. 10]

FIG. 10 is a cross-sectional view of a power semiconductor module according to a second embodiment of the present invention. In the present embodiment, a curvature protruding toward a housing space of a case 5 is formed not only in an intermediate member 5D but also in an intermediate member 5E facing the intermediate member 5D, the curvature in the intermediate member 5E being formed similarly to the curvature in the intermediate member 5D. As a result, the intermediate member 5E presses a second heat dissipating member 5B toward a circuit body 100 while the intermediate member 5D presses a first heat dissipating member 5A toward the circuit body 100, whereby the circuit body 100 and the joint member 6 are held between the first heat dissipating member 5A and the second heat dissipating member 5B with a greater force. The residual stress in the joint member 6 can be reduced in this case as well since the protrusion described in the first embodiment is formed in both of the intermediate members 5D and 5E. Note that the present embodiment can obtain the effect similar to that of the first embodiment by appropriately combining the position and the region in which the protrusion is formed, as illustrated in FIGS. 3, 5, 7, and 8, on the intermediate member 5E side.

Third Embodiment

Figure 11:
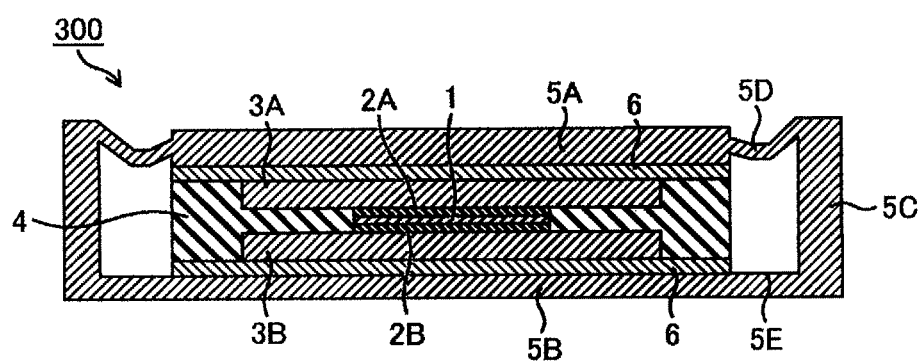
[FIG. 11]

FIG. 11 is a cross-sectional view of a power semiconductor module according to a third embodiment of the present invention. An intermediate member 5D in the present embodiment is formed thinner than a first heat dissipating member 5A. As a result, the reaction force in the intermediate member 5D generated in the second assembly process (FIG. 2(*b*)) can be reduced and, at the same time, the processability in the third assembly process (FIG. 2(*d*)) can be improved. Furthermore, in the third assembly process where a load for deforming the intermediate member 5D is applied while the first heat dissipating member 5A and a circuit body 100 are in close contact with each other through a joint member 6, approximately half the load is conveyed to the joint member 6 and the circuit body 100, leaving another half to be conveyed to a side wall 5C. At this time, it is concerned that the circuit body 100 and the joint member 6 may be damaged when the load applied to deform the intermediate member 5D is too large. By forming the intermediate member 5D thinner than the first heat dissipating member 5A, the load for deforming the intermediate member 5D can be reduced while preventing damage done to the circuit body 100 and the joint member 6 at the same time.

Note that the aforementioned effect can be obtained by forming the intermediate member 5E illustrated in FIG. 10 thinner than the first heat dissipating member 5A.

Fourth Embodiment

Figure 12:
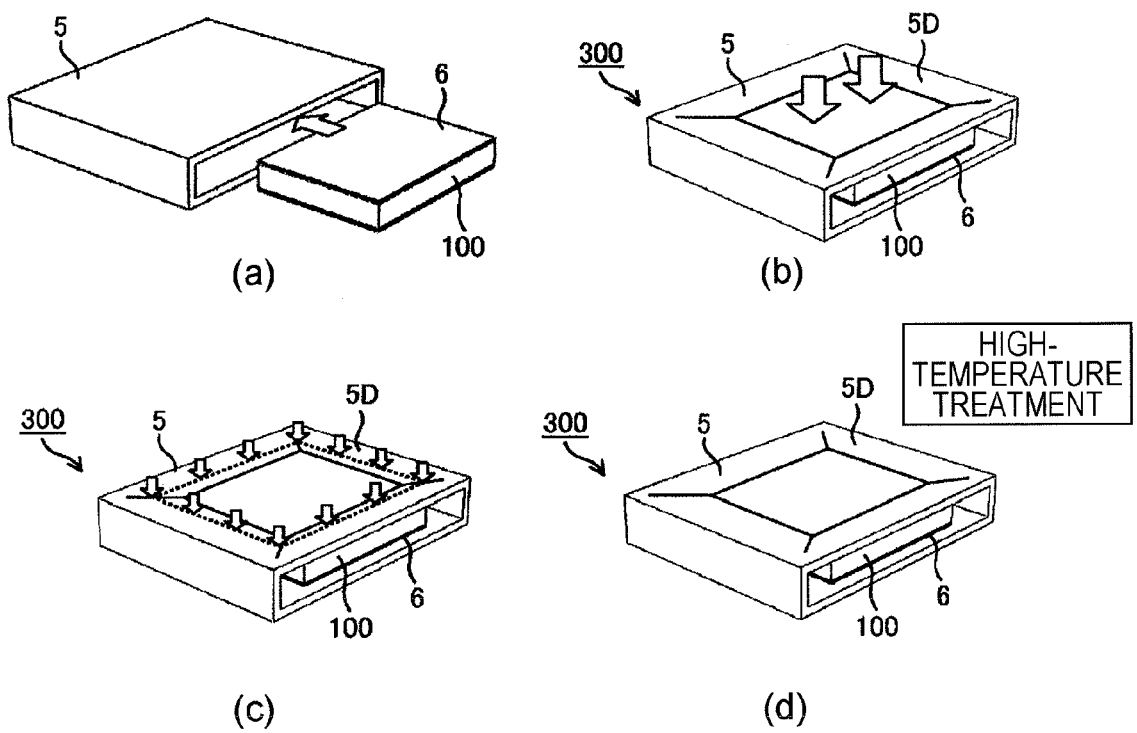
[FIG. 12]

FIGS. 12(*a*) to 12(*d*) are a set of diagrams illustrating an assembly process of a power semiconductor module 300 according to a fourth embodiment of the present invention. The present embodiment is different from the aforementioned embodiment in that the power semiconductor module 300 is subjected to a high-temperature heat treatment illustrated in FIG. 12(*d*) concurrently with or after the third assembly process illustrated in FIG. 2(*d*) is performed. As a result of the high-temperature treatment process, the joint member 6 can exhibit a connection retaining force, the reaction force generated in the intermediate member 5D of the metal case 5 can be reduced, and the residual stress generated in the joint member 6 after connection can be reduced.

A condition for the high-temperature treatment and an effect thereof will be described with reference to FIGS. 13 and 14.

FIG. 13 is a table illustrating a melting point of a general solder alloy. When the joint member 6 is formed of solder alloy with a melting point of 135° C. in general, for example, the joint member needs to be subjected to the heat treatment at 135° C. or higher in order to melt the solder alloy once for connecting the members and gain the connection retaining force. When the connecting member contains a resin component such as an adhesive sheet or a conductive adhesive containing a fine metal particle, on the other hand, a cross-linking reaction occurs within the material under high temperature. It is thus generally the case that, at the time of manufacturing, the connecting member is subjected to the heat treatment at 120° C. or higher which corresponds to a use temperature range of a general power semiconductor module in order to make the material resistant to change under the use environment. It is therefore required that the joint member 6 be subjected to the high-temperature heat treatment at 120° C. or higher in the third process.

Figure 14:
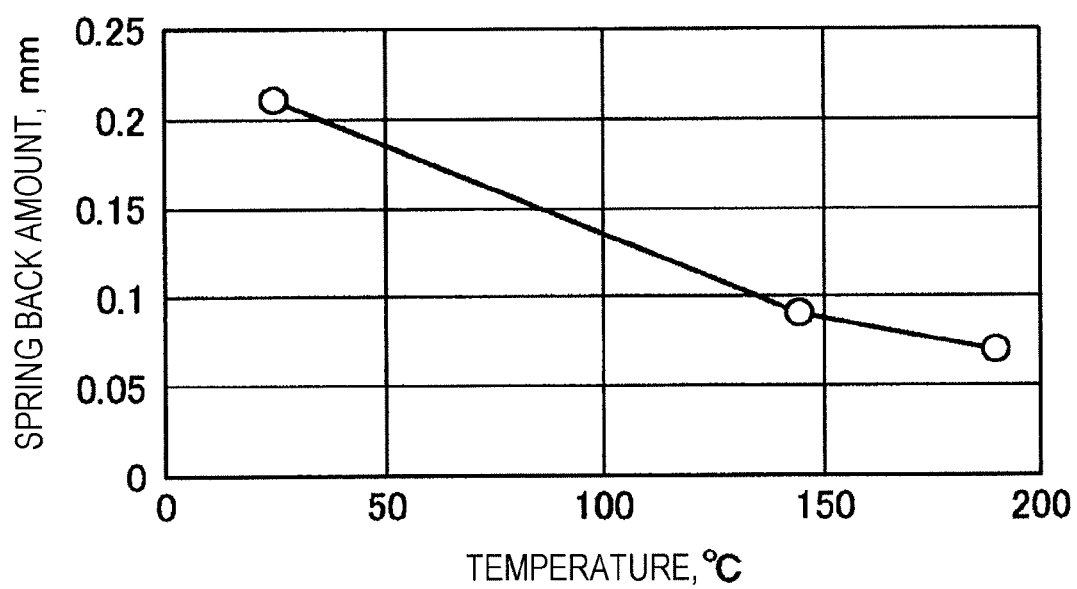
[FIG. 14]

FIG. 14 is a graph illustrating a relationship between a restoring amount (a spring back amount) of case 5 and a temperature at that time, the spring back amount being generated when pressure on the case 5 is released after a member simulating a circuit body 100 is inserted into the case 5 so that the case is pressurized and deformed. It can be understood from the graph that the restoring amount of the case 5 decreases by raising the temperature. This means that the high-temperature treatment is preferably performed at a higher temperature in order to reduce the reaction force against deformation of the metal case 5.

Therefore, in order for the joint member 6 to obtain the connection retaining force and for the reaction force against the pressing and deforming of the intermediate member 5D of the metal case 5 to be reduced by subjecting the deformed metal case 5 and the circuit body 100 to the high-temperature treatment simultaneously, it is required that the high-temperature treatment be performed at 120° C. or higher.

Fifth Embodiment

A power conversion device using the power semiconductor module described in any one of the first to the fourth embodiments will be described in the present embodiment.

While the power conversion device according to the embodiment of the present invention can be applied to a hybrid vehicle or a pure electric vehicle, a control structure and a circuit configuration of the power conversion device applied to the hybrid vehicle will be described below as a representative example with reference to FIGS. 15 and 16.

Figure 15:
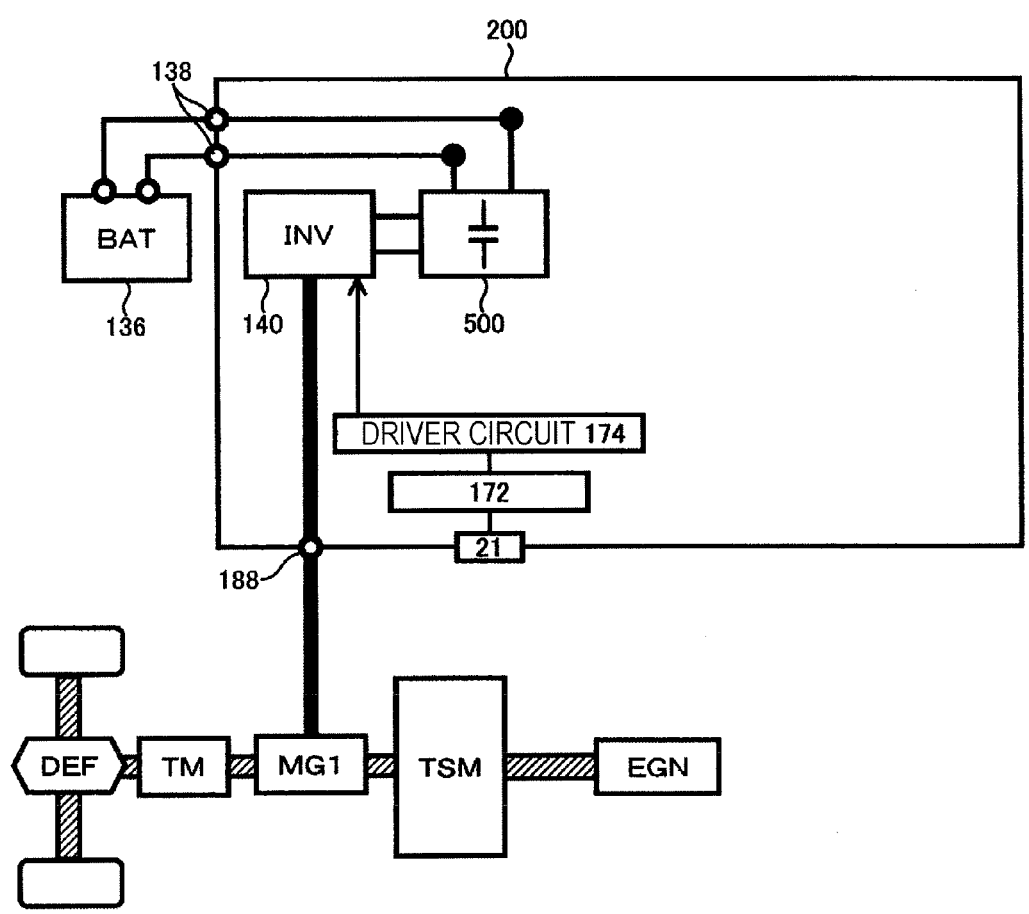
[FIG. 15]
Figure 16:
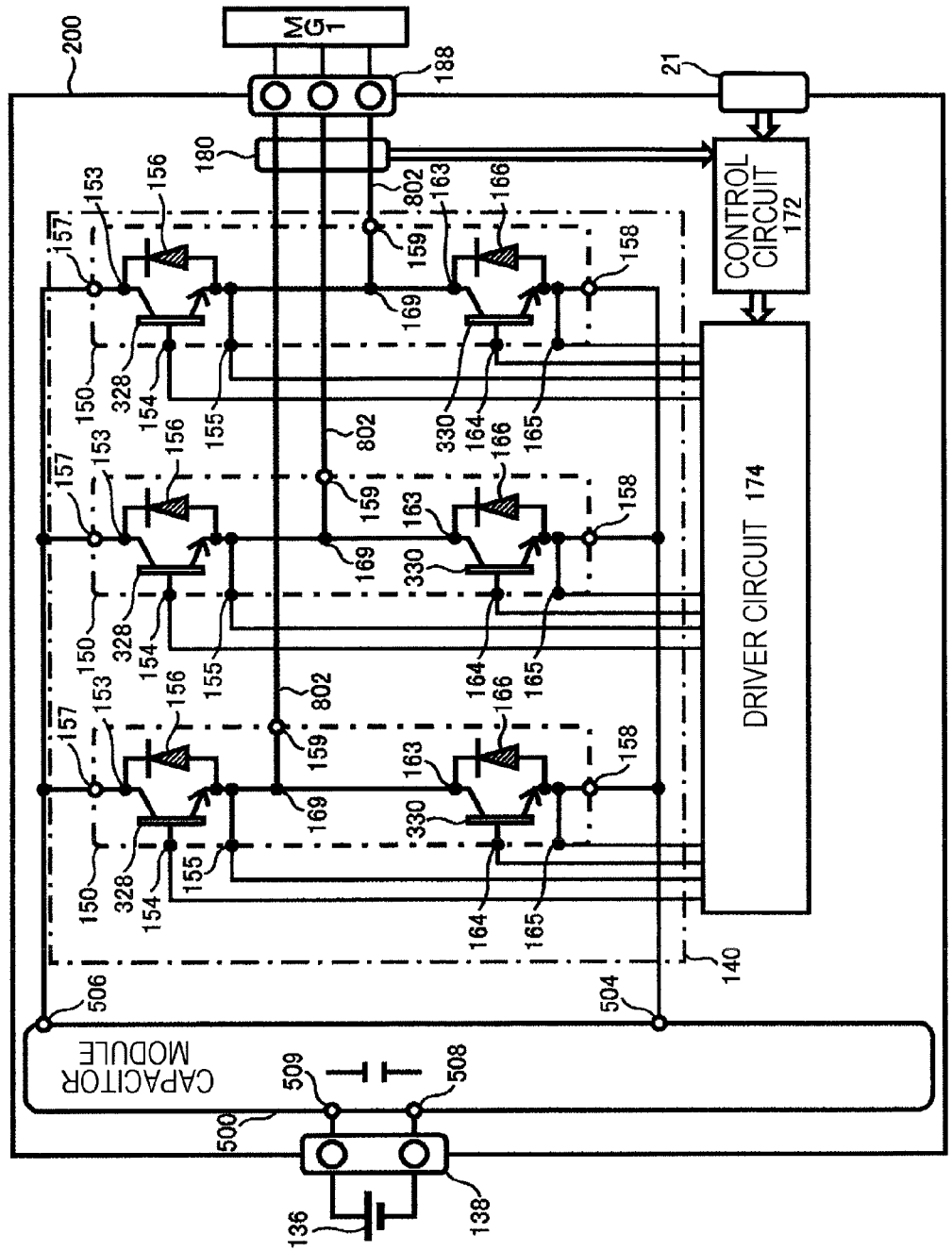
[FIG. 16]

FIG. 15 is a diagram illustrating a control block of a hybrid vehicle (hereinafter referred to as an "HEV"). An engine EGN and a motor generator MG1 generate a vehicle driving torque. The motor generator MG1 not only generates rotational torque but also has a function to convert mechanical energy applied to the motor generator MG1 from outside into electric power.

The motor generator MG1 is a synchronous machine or an induction machine, for example, and operates as a motor or a generator depending on a driving mode as described above. It is desired that the motor generator MG1 can output high power with a small size when mounted in a vehicle, in which case a permanent magnet synchronous motor is suited, the permanent magnet using a magnet such as neodymium. Moreover, the permanent magnet synchronous motor has a rotor generating less heat compared to a rotor in an induction motor and, from this point of view, is superior for use in a vehicle.

Output torque on the output side of the engine EGN is conveyed to the motor generator MG1 via a power transfer mechanism TSM, whereas rotational torque from the power transfer mechanism TSM or the rotational torque generated by the motor generator MG1 is conveyed to a wheel via a transmission TM and a differential gear DEF. When the vehicle is operated in a regenerative braking mode, on the other hand, rotational torque is conveyed from the wheel to the motor generator MG1, which then generates AC power by the rotational torque supplied. The generated AC power is converted into DC power by a power conversion device 200 as will be described below and is used to charge a high-voltage battery 136 so that the charged power is used as driving energy again.

The power conversion device 200 will now be described. An inverter circuit 140 is electrically connected to the battery 136 through a DC connector 138, where electric power is transferred between the battery 136 and the inverter circuit 140. When the motor generator MG1 is operated as a motor, the inverter circuit 140 generates AC power on the basis of DC power supplied from the battery 136 via the DC connector 138 and supplies the power to the motor generator MG1 through an AC terminal 188. The configuration including the motor generator MG1 and the inverter circuit 140 operates as a first motor-generator unit.

In the present embodiment, a vehicle can be driven by the power of the motor generator MG1 alone by operating the first motor-generator unit as a motor unit by the power of the battery 136. Moreover, in the present embodiment, the battery 136 can be charged by the first motor-generator unit operating and generating power as a generator unit by the power from an engine 120 or the wheel.

Although omitted from FIG. 15, the battery 136 can also be used as a power source to drive a motor for an auxiliary machine. The motor for an auxiliary machine can be a motor that drives an air conditioner compressor or a motor that drives a control hydraulic pump, for example. In this case, DC power is supplied from the battery 136 to a power semiconductor module for an auxiliary machine, which then generates AC power and supplies it to the motor for an auxiliary machine. The power semiconductor module for an auxiliary machine has the circuit configuration and the function that are basically similar to those of the inverter circuit 140 to control a phase, a frequency and power of the alternating current supplied to the motor for an auxiliary machine. Note that the power conversion device 200 includes a capacitor module 500 for smoothing the DC power supplied to the inverter circuit 140.

The power conversion device 200 includes a communication connector 21 that receives a command from an upper control unit or transmits status data to the upper control unit. A control circuit 172 in the power conversion device 200 computes a controlled variable of the motor generator MG1 on the basis of a command input from the connector 21, computes whether the motor generator is to be operated as the motor or the generator, generates a control pulse on the basis of the computation result, and supplies the control pulse to a driver circuit 174. The driver circuit 174 generates a drive pulse on the basis of the supplied control pulse in order to control the inverter circuit 140.

The structure of the electric circuit of the inverter circuit 140 will now be described with reference to FIG. 16. Note that an insulated gate bipolar transistor used below as a semiconductor element will be hereinafter abbreviated as an IGBT. An IGBT 328 and a diode 156 that operate as an upper arm, and an IGBT 330 and a diode 166 that operate as a lower arm together constitute an upper and lower arm series circuit 150. The inverter circuit 140 includes three of the series circuit 150 corresponding to a U-phase, a V-phase, and a W-phase of the AC power to be output, respectively.

The three phases correspond to respective three phase coils of an armature coil in the motor generator MG1 in the present embodiment. Each upper and lower arm series circuit 150 outputs an alternating current from an intermediate electrode 169 that is a midpoint of the series circuit. The intermediate electrode 169 is connected to AC busbars 802 and 804 being an AC power line to the motor generator MG1 through AC terminals 159 and 188. The description of the AC busbar will be given later.

A collector electrode 153 of the IGBT 328 in the upper arm is electrically connected to a capacitor terminal 506 on the positive side of the capacitor module 500 through a positive terminal 157. On the other hand, an emitter electrode of the IGBT 330 in the lower arm is electrically connected to a capacitor terminal 504 on the negative side of the capacitor module 500 through a negative terminal 158.

As described above, the control circuit 172 receives a control command from the upper control unit through the connector 21 to generate the control pulse on the basis of the control command and supply it to the driver circuit 174, the control pulse serving as a control signal to control the IGBT 328 or 330 constituting the upper arm or the lower arm of the series circuit 150 for each phase included in the inverter circuit 140.

On the basis of the control pulse, the driver circuit 174 supplies, to the IGBT 328 or 330 in each phase, a drive pulse that controls the IGBT 328 or 330 constituting the upper arm or the lower arm of the series circuit 150 for each phase. The IGBT 328 or 330 conducts or interrupts current on the basis of the drive pulse supplied from the driver circuit 174 and converts DC power supplied from the battery 136 into three-phase AC power, which is then supplied to the motor generator MG1.

The IGBT 328 includes the collector electrode 153, a signal emitter electrode 155, and a gate electrode 154 while the IGBT 330 includes a collector electrode 163, a signal emitter electrode 165, and a gate electrode 164. The diode 156 is electrically connected between the collector electrode 153 and the emitter electrode 155. The diode 166 is electrically connected between the collector electrode 163 and the emitter electrode 165.

A metal oxide semiconductor field effect transistor (hereinafter abbreviated as a MOSFET) may also be used as the power semiconductor element used for switching, in which case the diode 156 or 166 would be unneeded. As the power semiconductor element used for switching, the IGBT is suitable when DC voltage is relatively high while the MOSFET is suitable when DC voltage is relatively low.

The capacitor module 500 includes the capacitor terminal 506 on the positive side, the capacitor terminal 504 on the negative side, a power supply terminal 509 on the positive side, and a power supply terminal 508 on the negative side. The high-voltage DC power from the battery 136 is supplied to the power supply terminal 509 on the positive side and the power supply terminal 508 on the negative side through the DC connector 138 and then from the capacitor terminal 506 on the positive side and the capacitor terminal 504 on the negative side of the capacitor module 500 to the inverter circuit 140.

On the other hand, the DC power converted from AC power by the inverter circuit 140 is supplied to the capacitor module 500 through the capacitor terminal 506 on, the positive side and the capacitor terminal 504 on the negative side and then to the battery 136 from the power supply terminal 509 on the positive side and the power supply terminal 508 on the negative side through the DC connector 138, whereby the power is stored in the battery 136.

The control circuit 172 includes a microcomputer (hereinafter referred to as a "microcomputer") which calculates a switching timing of the IGBTs 328 and 330. A target torque value required for the motor generator MG1, a current value supplied from the series circuit 150 to the motor generator MG1, and a magnetic pole position of the rotor of the motor generator MG1 are input into the microcomputer as input information.

The target torque value is based on a command signal output from the upper control unit that is not shown. The current value is detected on the basis of a detection signal output from a current sensor 180. The magnetic pole position is detected on the basis of a detection signal output from a rotary magnetic pole sensor (not illustrated) such as a resolver provided in the motor generator MG1. The current sensor 180 in the present embodiment detects the current value for three phases but may also be adapted to detect a current value for two phases only and find the current value for three phases by calculation.

The microcomputer incorporated in the control circuit 172 calculates d-axis and q-axis current command values for the motor generator MG1 on the basis of the target torque value, calculates d-axis and q-axis voltage command values on the basis of the difference between the calculated d-axis and q-axis current command values and the detected d-axis and q-axis current values, and then converts the calculated d-axis and q-axis voltage command values into U-phase, V-phase, and W-phase voltage command values based on the detected magnetic pole position. The microcomputer then generates a pulse form modulated wave on the basis of the comparison between a fundamental wave (sine wave) based on the U-phase, the V-phase, and the W-phase voltage command values and a carrier wave (triangle wave), and outputs the modulated wave generated to the driver circuit 174 as a PWM (pulse width modulated) signal.

When driving the lower arm, the driver circuit 174 amplifies the PWM signal which is to be output as a drive signal to the gate electrode of the IGBT 330 of the corresponding lower arm. When driving the upper arm, on the other hand, the driver circuit 174 amplifies the PWM signal after shifting the level of a reference potential of the PWM signal to the level of a reference potential of the upper arm, and then outputs the amplified signal as a drive signal to each gate electrode of the IGBT 328 of the corresponding upper arm.

The microcomputer incorporated in the control circuit 172 also performs anomaly detection (over-current, over-voltage, over-temperature or the like) in order to protect the series circuit 150. Sensing information is thus input in the control circuit 172. For example, the information on the current flowing through the signal emitter electrodes 155 and 165 of the respective IGBTs 328 and 330 in the respective arms is input in a corresponding drive unit (IC). Accordingly, each drive unit (IC) performs over-current detection and stops the switching operation of the IGBTs 328 and 330 when the over-current has been detected so that the corresponding IGBTs 328 and 330 will be protected.

A temperature sensor (not illustrated) provided in the series circuit 150 inputs information on the temperature of the series circuit 150 into the microcomputer. Also input into the microcomputer is voltage information on the DC positive side of the series circuit 150. On the basis of these pieces of information, the microcomputer performs over-temperature and over-voltage detection and stops the switching operation of all the IGBTs 328 and 330 when the over-temperature or the over-voltage has been detected.

Figure 17:
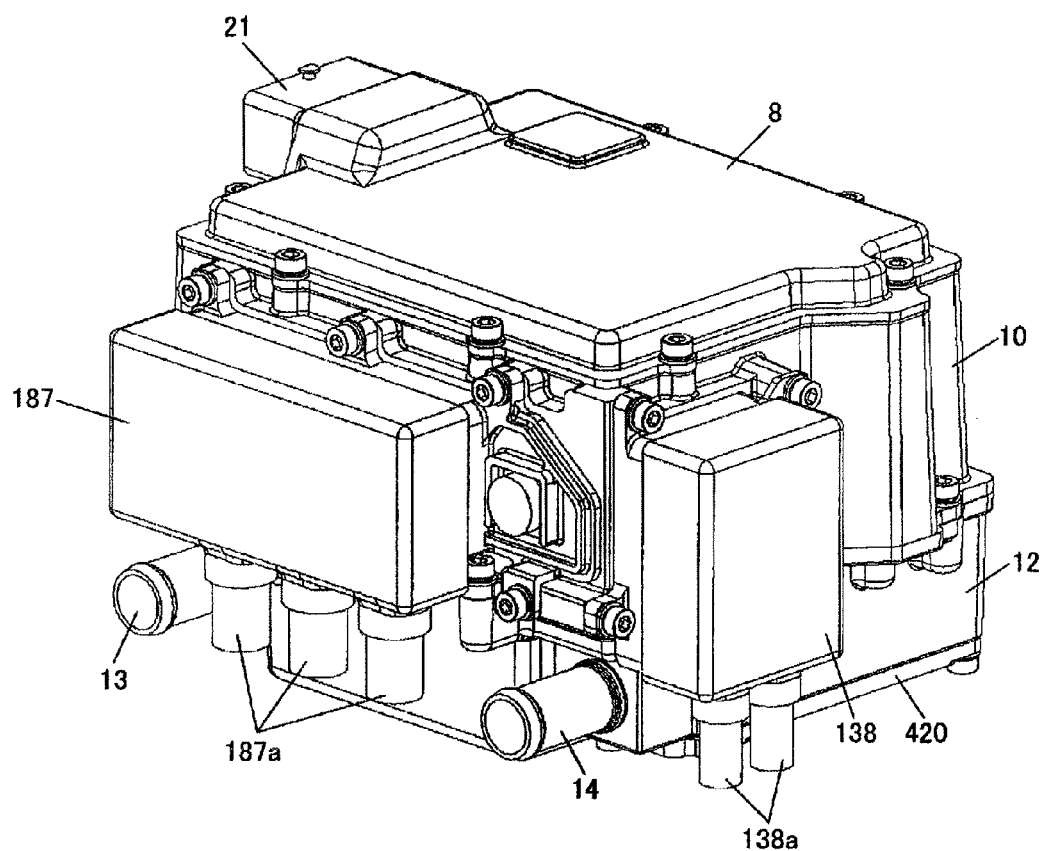
[FIG. 17]
Figure 18:
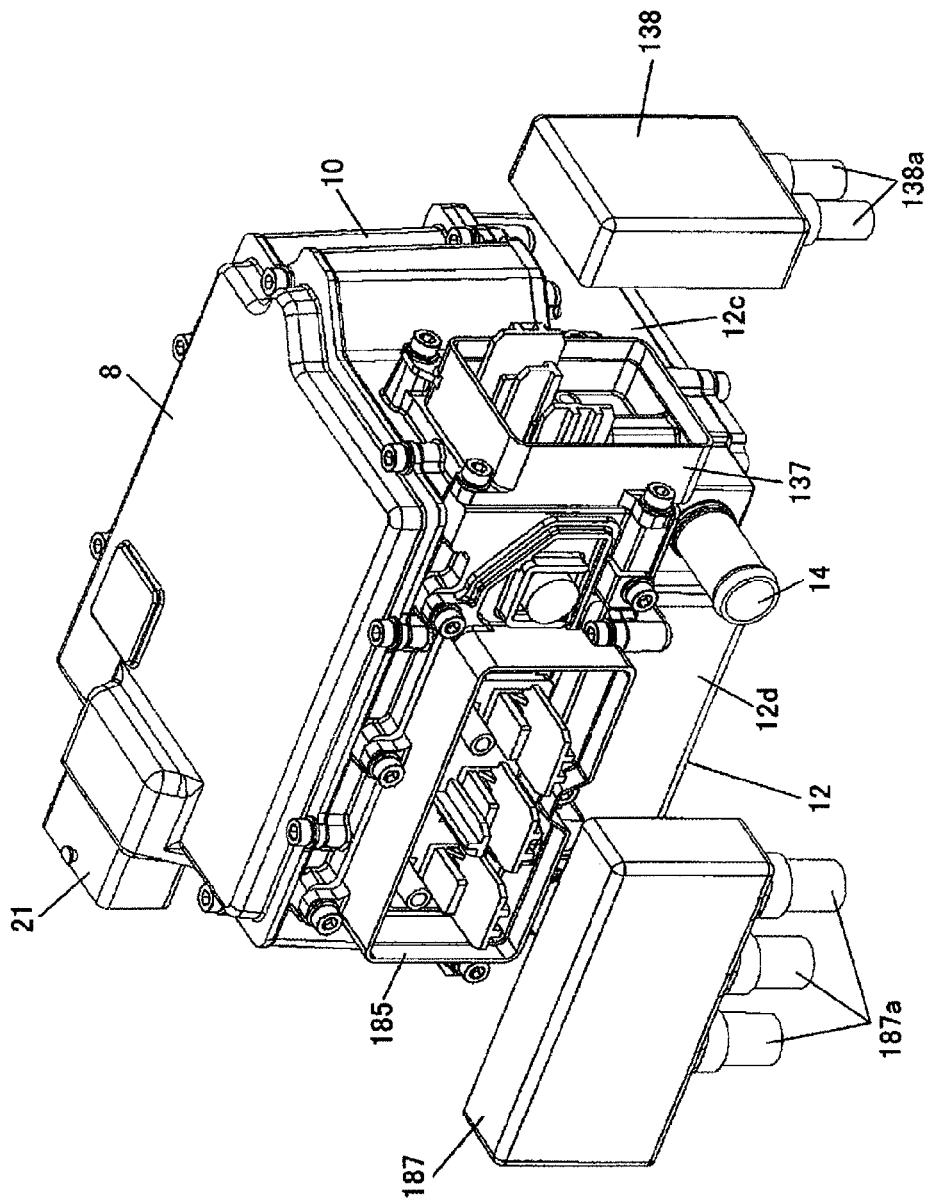
[FIG. 18]

FIGS. 17 and 18 are exterior perspective views of the power conversion device 200 according to the embodiment of the present invention, where the AC connector 187 and the DC connector 138 are removed from the power conversion device in FIG. 18. The power conversion device 200 according to the present embodiment is formed into a rectangular parallelepiped with a substantially square planar shape, so that the device can be downsized and easily mounted in the vehicle. A reference sign 8 denotes a cover, 10 denotes a housing, 12 denotes a passage forming body, 13 denotes an inlet pipe for a cooling medium, 14 denotes an outlet pipe, and 420 denotes a bottom cover. The connector 21 for signaling is provided to be connected with the outside.

The cover 8 is fixed to an upper opening of the housing 10 in which a circuit component constituting the power conversion device 200 is housed. The passage forming body 12 fixed at the bottom of the housing 10 is provided to hold in place the power semiconductor module 300 and the capacitor module 500 to be described below and to cool these modules by the cooling medium at the same time. Water is often used as the cooling medium and therefore will be described as the cooling medium below. An inlet pipe 13 and an outlet pipe 14 are provided on a side surface of the passage forming body 12, where the cooling medium supplied from the inlet pipe 13 flows through a passage 19 to be described within the passage forming body 12 and flows out from the outlet pipe 14. The direction which the cooling medium flows in/out does not greatly affect the cooling efficiency or the pressure loss. This means that the cooling efficiency or the pressure loss substantially stays unchanged when the cooling medium flows in from the outlet pipe 14 and flows out of the inlet pipe 13. That is, in the power conversion device 200 according to the present embodiment, the inlet pipe 13 and the outlet pipe 14 are arranged symmetrically about the center of the power conversion device 200 so that the arrangement can be changed in accordance with a wiring state of the coolant pipe in the vehicle.

Provided on a side surface of the housing 10 is an AC interface 185 to which the AC connector 187 is mounted and a DC interface 137 to which the DC connector 138 is mounted. The AC interface 185 is provided on the side surface on which the pipes 13 and 14 are provided, while an AC wiring 187a of the AC connector 187 mounted to the AC interface 185 passes between the pipes 13 and 14 to extend downward. The DC interface 137 is provided on a side surface adjacent to the side surface on which the AC interface 185 is provided, while a DC wiring 135J of the DC connector 138 mounted to the DC interface 137 extends toward the downward side of the power conversion device 200.

Figure 19:
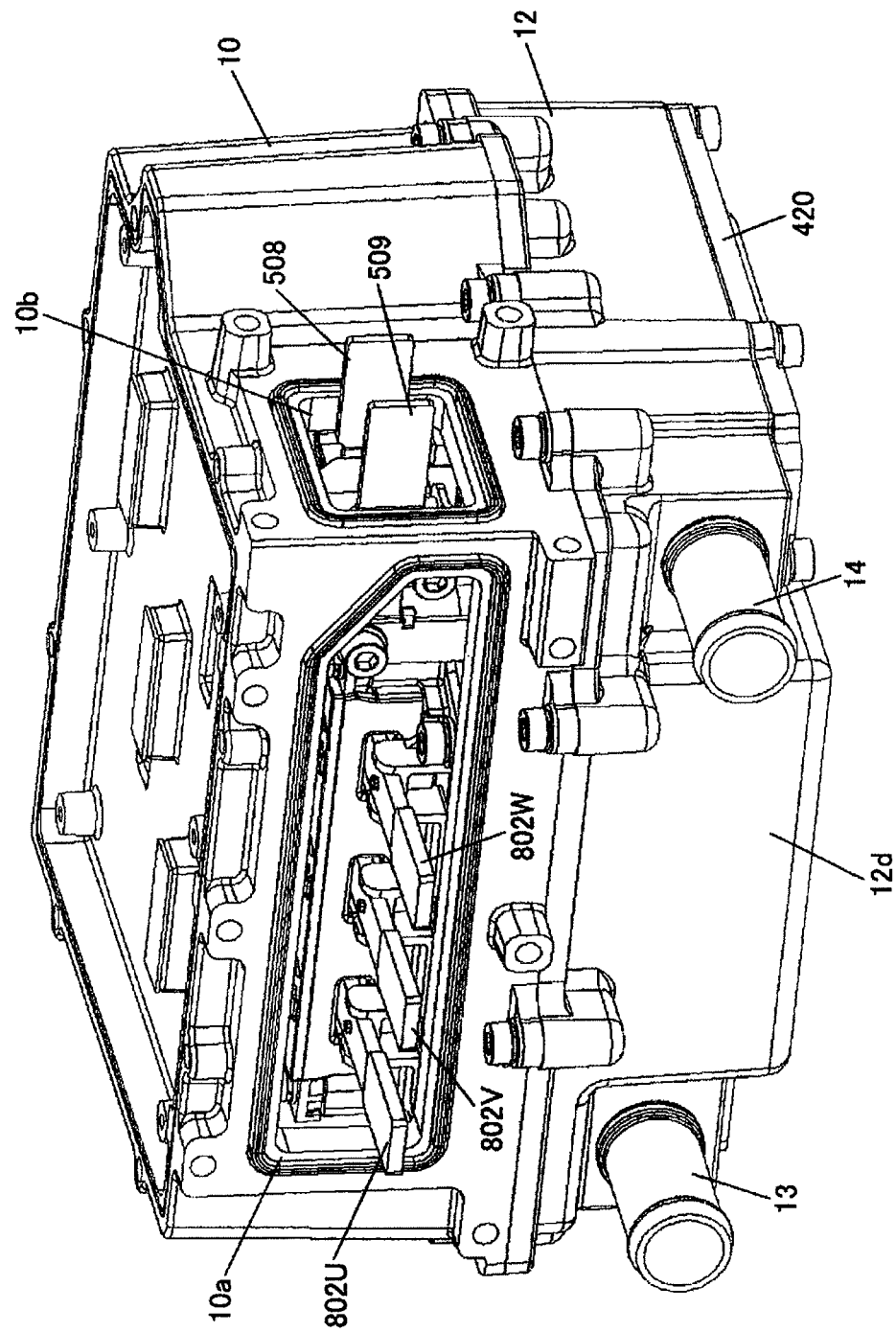
[FIG. 19]
Figure 20:
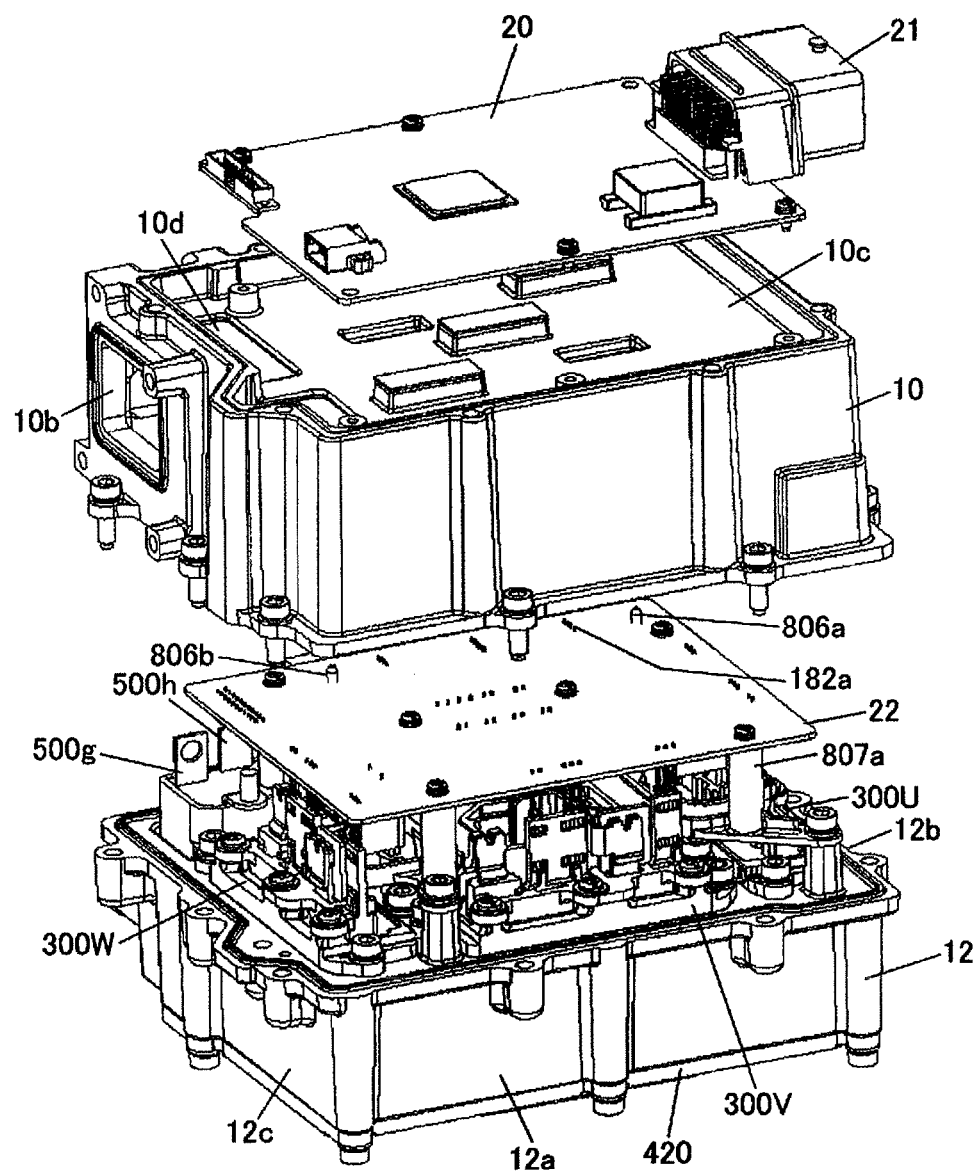
[FIG. 20]
Figure 21:
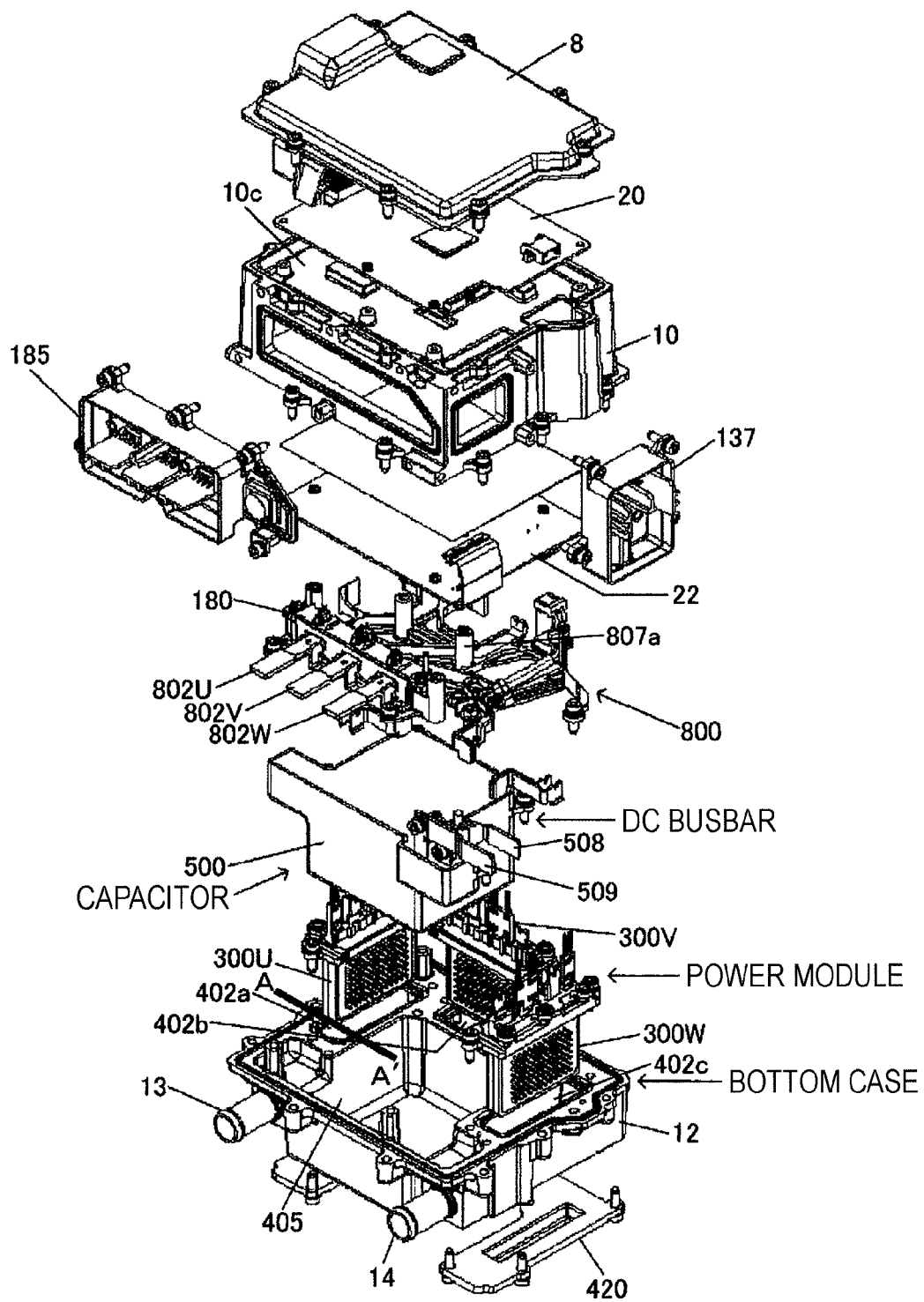
[FIG. 21]

The AC interface 185 and the pipes 13 and 14 are disposed on a same side surface 12d such that the AC wiring 187a is drawn out downward between the pipes 13 and 14, whereby the space occupied by the pipes 13 and 14, the AC connector 187, and the AC wiring 187a can be kept small to suppress upsizing of the device as a whole. In addition, the productivity is improved by the easy handling of the AC wiring 187a drawn out downward with respect to the pipes 13 and 14. FIG. 19 is a diagram illustrating the power conversion device 200 in FIG. 18 from which the cover 8, the DC interface 137, and the AC interface 185 are removed. An opening 10a to which the AC interface 185 is fixed is formed on one side surface of the housing 10 while an opening 10b to which the DC interface 137 is fixed is formed on another side surface adjacent to the one side surface. Three AC busbars 802, namely a U-phase AC busbar 802U, a V-phase AC busbar 802V, and a W-phase AC busbar 802W, are projected out from the opening 10a whereas the power supply terminals 508 and 509 on a DC side are projected out from the opening 10b. FIG. 20 is a diagram in which the housing 10 is removed from the passage forming body 12 illustrated in FIG. 19. The housing 10 includes an upper housing space and a lower housing space that are partitioned by a partition wall 10c. A control circuit board 20 to which the connector 21 is fixed is housed in the upper housing space, while a driver circuit board 22 and the busbar assembly 800 to be described are housed in the lower housing space. The control circuit 172 illustrated in FIG. 16 is mounted on the control circuit board 20, while the driver circuit board 174 is mounted on the driver circuit board 22. The control circuit board 20 and the driver circuit board 22 are connected by way of a flat cable not illustrated (refer to FIG. 21) that is drawn out from the lower housing space to the upper housing space through a slit-like opening 10d formed on the partition wall 10c. FIG. 21 is an exploded perspective view of the power conversion device 200. The control circuit board 20 mounted with the aforementioned control circuit 172 is disposed on the inner side of the cover 8, namely, the upper housing space of the housing 10. An opening 5J for the connector 21 is formed in the cover 8. The low-voltage DC power that operates the control circuit within the power conversion device 200 is supplied from the connector 21.

While described in detail below, the passage forming body 12 includes a passage which the cooling medium flowed in from the inlet pipe 13 flows through. The passage is formed into a U-shape along three side surfaces of the passage forming body 12. The cooling medium having flowed into one end of the U-shaped passage from the inlet pipe 13 flows through the passage and out from the outlet pipe 14 connected to another end of the passage.

Three openings 402a to 402c are formed on the top surface of the passage so that the power semiconductor modules 300U, 300V, and 300W with the series circuit 150 (refer to FIG. 15) built therein are inserted into the passage from these openings 402a to 402c. The U-phase series circuit 150 is built in the power semiconductor module 300U, the V-phase series circuit 150 is built in the power semiconductor module 300V, and the W-phase series circuit 150 is built in the power semiconductor module 300W. The power semiconductor modules 300U to 300W are identical in structure and appearance. The openings 402a to 402c are closed by a flange part of each of the power semiconductor modules 300U to 300W inserted into the openings.

The passage forming body 12 includes a housing space 405 which is enclosed by the U-shaped passage and houses an electrical component. The capacitor module 500 is housed in the housing space 405 in the present embodiment and is cooled by the cooling medium flowing through the passage. Arranged above the capacitor module 500 is the busbar assembly 800 mounted with the AC busbars 802U to 802W and fixed to the top surface of the passage forming body 12. The current sensor 180 is fixed to the busbar assembly 800.

The driver circuit board 22 is arranged above the busbar assembly 800 while fixed in position by a supporting member 807a that is provided in the busbar assembly 800. The control circuit board 20 and the driver circuit board 22 are connected by a flat cable 23, as described above. The flat cable 23 is drawn from the lower housing space and out to the upper housing space through the slit-like opening 10d formed on the partition wall 10c.

The power semiconductor modules 300U to 300W, the driver circuit board 22, and the control circuit board 20 are hierarchically arranged in the height direction so that the control circuit board 20 is disposed farthest away from the electric system that is the power semiconductor modules 300U to 300W. As a result, the intrusion of a switching noise or the like to the side of the control circuit board 20 can be reduced. Moreover, the driver circuit board 22 and the control circuit board 20 are arranged in the separate housing spaces partitioned by the partition wall 10c which functions as an electromagnetic shield so that the intrusion of noise from the driver circuit board 22 into the control circuit board 20 can be reduced. Note that the housing 10 is formed of metal such as aluminum.

Being fixed to the partition wall 10c that is formed in integration with the housing 10, the control circuit board 20 has a high mechanical resonance frequency for the vibration applied from outside and is therefore not easily affected by the vibration from the vehicle, thereby resulting in the improved reliability.

The passage forming body 12 as well as the power semiconductor modules 300U to 300W, the capacitor module 500, and the busbar assembly 800 that are fixed in the passage forming body 12 will now be described in more detail. FIG.

Figure 23:
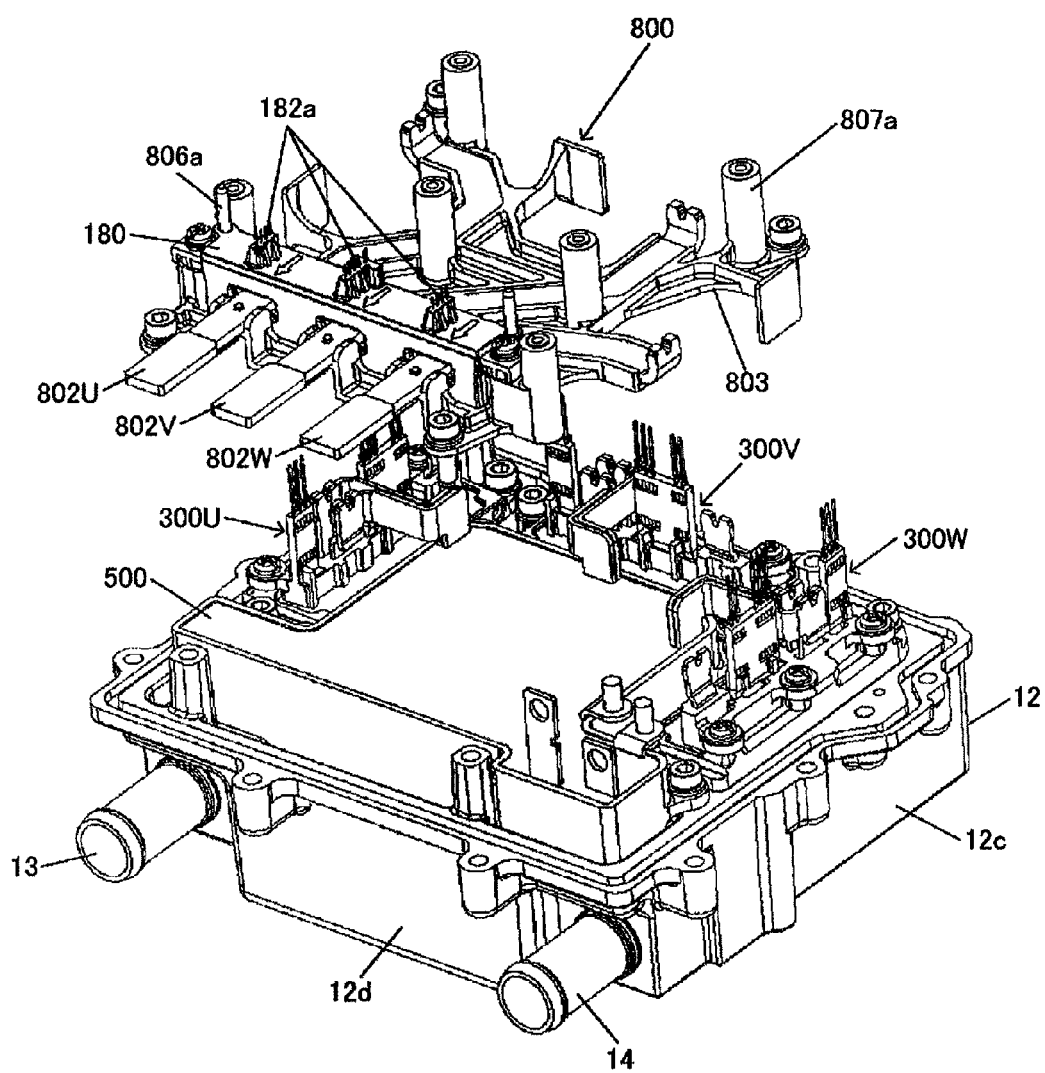
[FIG. 23]

22 is an exterior perspective view in which the power semiconductor modules 300U to 300W, the capacitor module 500, and the busbar assembly 800 are assembled in the passage forming body 12. FIG. 23 is a diagram in which the busbar assembly 800 is removed from the passage forming body 12. The busbar assembly 800 is bolted to the passage forming body 12.

Figure 24:
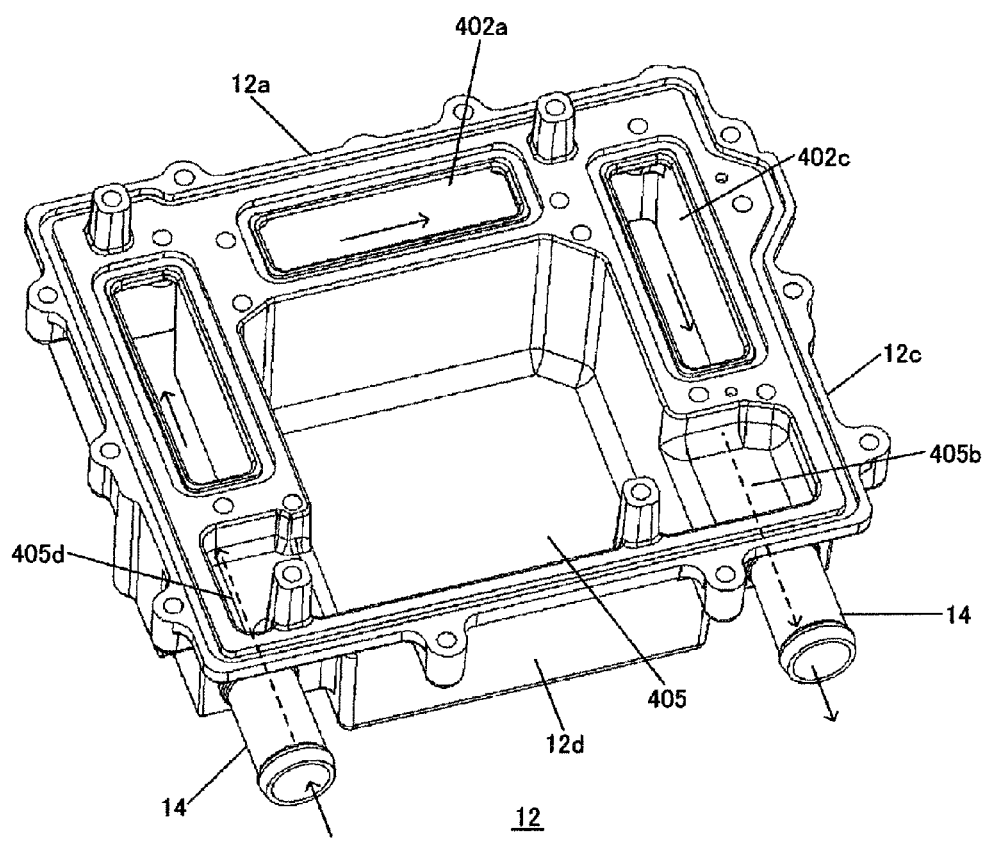
[FIG. 24]
Figure 25:
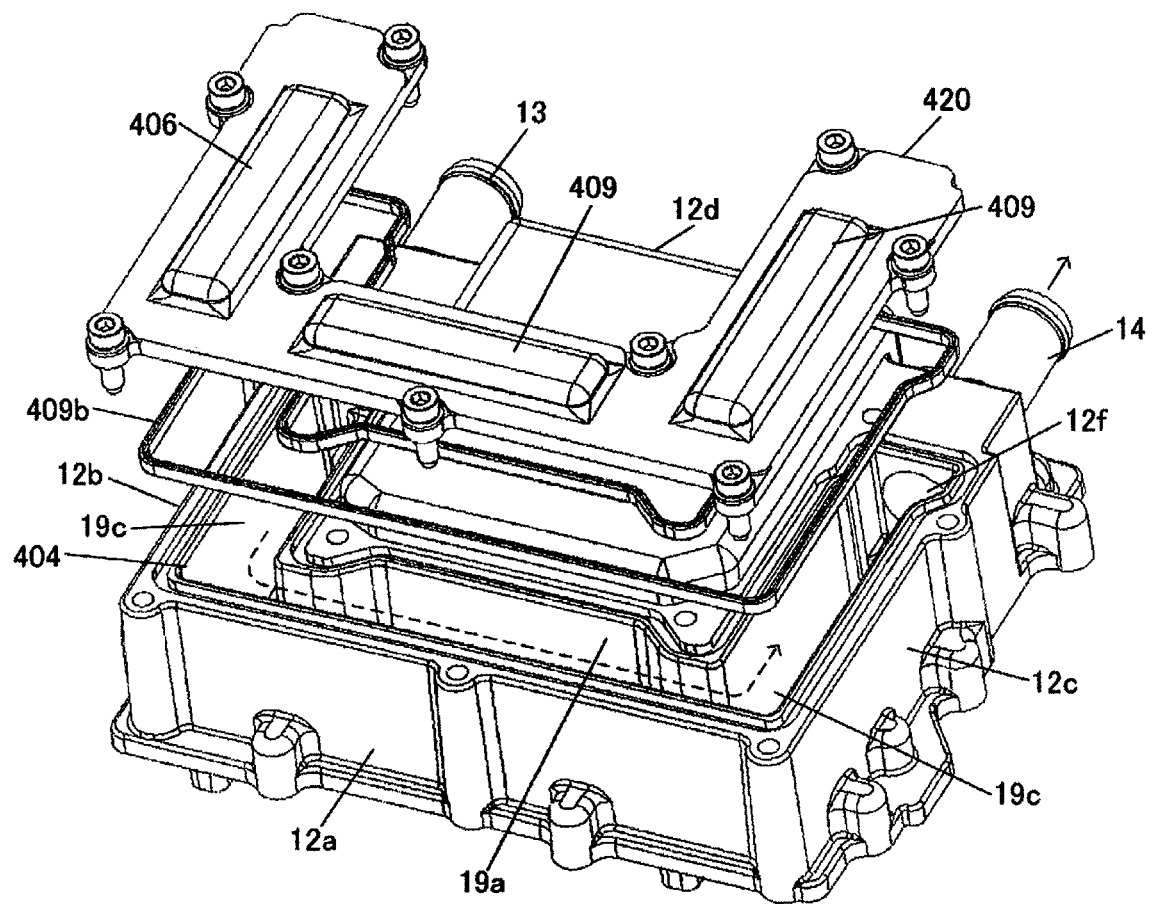
[FIG. 25]

The passage forming body 12 will be described first with reference to FIGS. 24 and 25. FIG. 24 is a perspective view of the passage forming body 12 while FIG. 25 is an exploded perspective view of the passage forming body 12 seen from the underside. As illustrated in FIG. 24, the passage forming body 12 is formed into a rectangular parallelepiped with a substantially square planar shape, where the inlet pipe 13 and the outlet pipe 14 are provided on the side surface 12d of the passage forming body. The side surface 12d here is formed step-wise at a portion where the pipes 13 and 14 are provided. As illustrated in FIG. 25, the passage 19 is formed into a U-shape along the other three side surfaces 12a to 12c of the passage forming body. Also formed on the underside of the passage forming body 12 is a one continuous opening 404 having a U-shape that is substantially identical to the cross section of the passage 19. The opening 404 is closed by the U-shaped bottom cover 420. A seal member 409a is provided between the bottom cover 420 and the passage forming body 12 to retain air-tightness therebetween.

The U-shaped passage 19 is divided into three passage sections 19a, 19b, and 19c according to the direction in which the cooling medium flows. A first passage section 19a is provided along the side surface 12a facing the side surface 12d on which the pipes 13 and 14 are provided, a second passage section 19b is provided along the side surface 12b adjacent to one side of the side surface 12a, and a third passage section 19c is provided along the side surface 12c adjacent to another side of the side surface 12a. The detail will be described below. Upon flowing into the passage section 19b from the inlet pipe 13, the cooling medium flows through the passage as indicated by a dotted arrow in the order of the passage section 19b, the passage section 19a, and the passage section 19c and flows out from the outlet pipe 14.

Formed on the top surface side of the passage forming body 12 as illustrated in FIG. 24 is the rectangular opening 402a parallel to the side surface 12a and positioned in opposed relation to the passage section 19a, the rectangular opening 402b parallel to the side surface 12b and positioned in opposed relation to the passage section 19b, and the rectangular opening 402c parallel to the side surface 12c and positioned in opposed relation to the passage section 19c. The power semiconductor modules 300U to 300W are inserted into the passage 19 through these openings 402a to 402c. As illustrated in FIG. 25, a projection 406 that is projected toward the downward side of the passage 19 is formed at a position in the bottom cover 420 opposing each of the openings 402a to 402c. Each projection 406 is recessed when seen from the passage 19 side, where the lower end of the power semiconductor modules 300U to 300W inserted from the openings 402a to 402c is fitted into the recess. The passage forming body 12 is formed such that the opening 404 and the openings 402a to 402c face each other, and is thus easily manufactured by aluminum casting.

As illustrated in FIG. 24, the rectangular housing space 405 is formed in the passage forming body 12 while three sides of the space is surrounded by the passage 19. The capacitor module 500 is housed in the housing space 405. The capacitor module 500 can be formed into a rectangular parallelepiped to be fitted into the rectangular parallelepiped housing space 405 surrounded by the passage 19, so that the productivity of the capacitor module 500 is improved.

Figure 26:
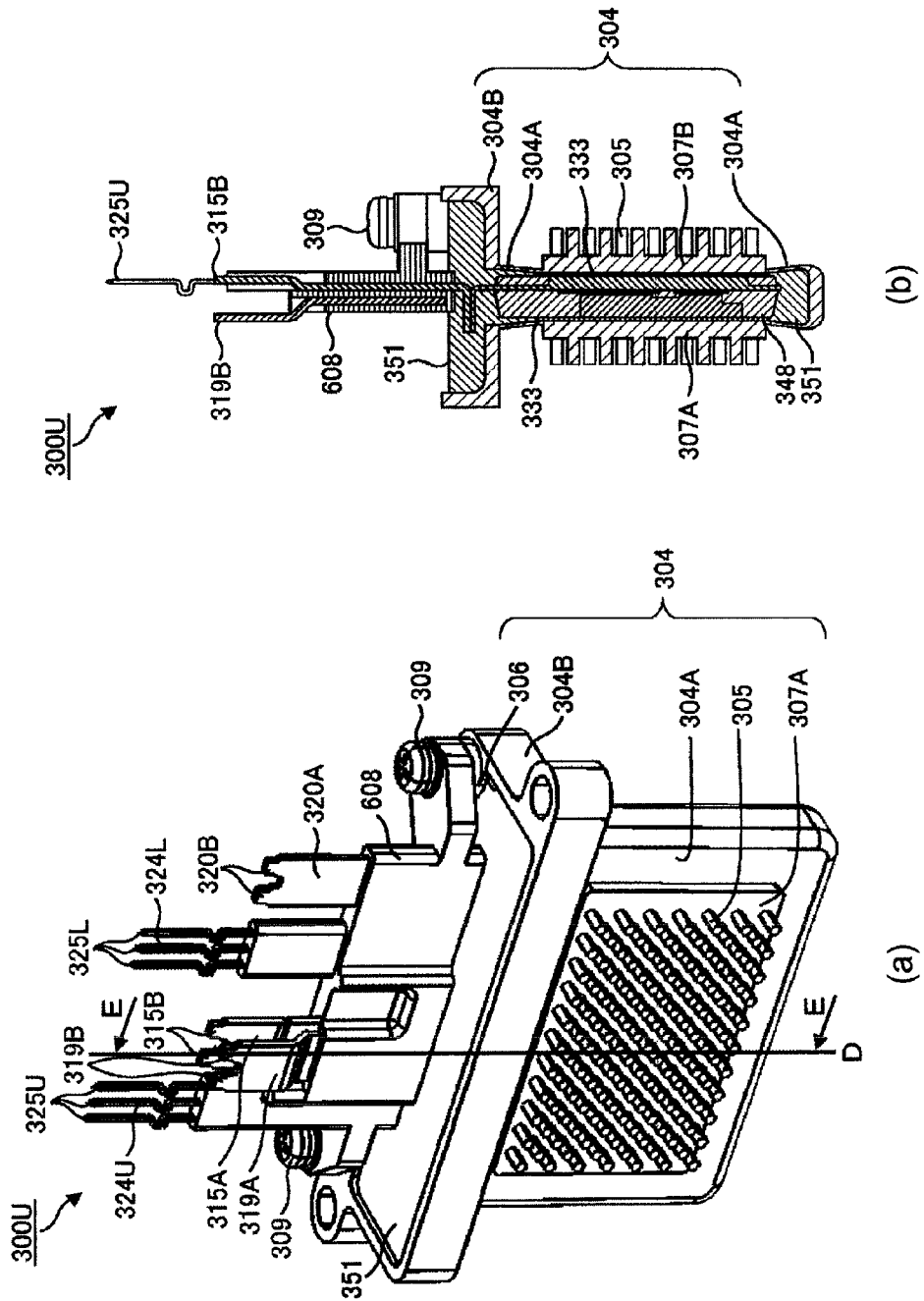
[FIG. 26]
Figure 27:
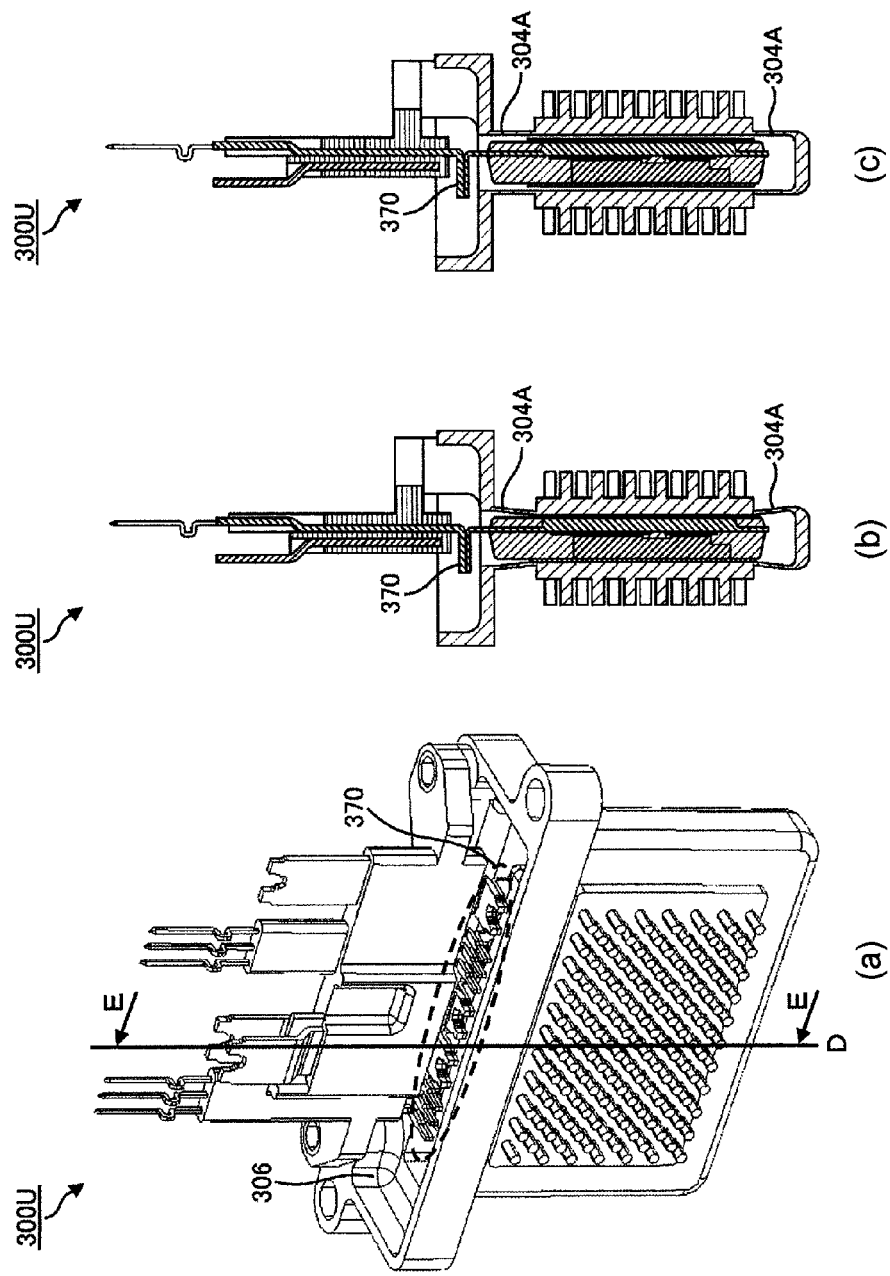
[FIG. 27]

The detailed structure of the power semiconductor modules 300U to 300W and power semiconductor modules 301a to 301c used for the inverter circuit 140 and an inverter circuit 142, respectively, will be described with reference to FIGS. 26 to 30. The structure of the power semiconductor module 300U will be described here as a representative example since the power semiconductor modules 300U to 300W and the power semiconductor modules 301a to 301c all have the same structure. Note that in FIGS. 26 to 30, a signal terminal 325U corresponds to the gate electrode 154 and the signal emitter electrode 155 disclosed in FIG. 2 whereas a signal terminal 325L corresponds to the gate electrode 164 and the emitter electrode 165 disclosed in FIG. 16. A DC positive terminal 315B is identical to the positive terminal 157 disclosed in FIG. 16 whereas a DC negative terminal 319B is identical to the negative terminal 158 disclosed in FIG. 16. Moreover, an AC terminal 320B is identical to the AC terminal 159 disclosed in FIG. 16. The detailed structure of the power semiconductor modules 300U to 300W and the power semiconductor modules 301a to 301c used for the inverter circuit 140 and the inverter circuit 142, respectively, will now be described with reference to FIGS. 26 to 30. FIG. 26(a) is a perspective view of the power semiconductor module 300U according to the present embodiment, and FIG. 26(b) is a cross-sectional view of the power semiconductor module 300U according to the present embodiment cut along cross section D and seen from direction E.

FIGS. 27(a) to 27(c) are diagrams illustrating the power semiconductor module 300U in FIG. 26 from which a screw 309 and a second sealing resin 351 are removed for better understanding of the structure. FIG. 27(a) is a perspective view of the power semiconductor module, while FIG. 27(b) is a cross-sectional view of the power semiconductor module cut along cross section D and seen from direction E similarly to FIG. 26(b). FIG. 27(c) is a cross-sectional view of the power semiconductor module before pressurizing a fin 305 to deform a curvature 304A.

FIGS. 28(a) and 28(b) are diagrams illustrating the power semiconductor module 300U in FIGS. 27(a) to 27(c) from which a module case 304 is further removed. FIG. 28(a) is a perspective view of the power semiconductor module, while FIG. 28(b) is a cross-sectional view of the power semiconductor module cut along cross section D and seen from direction E similarly to FIGS. 26(b) and 27(b).

Figure 28:
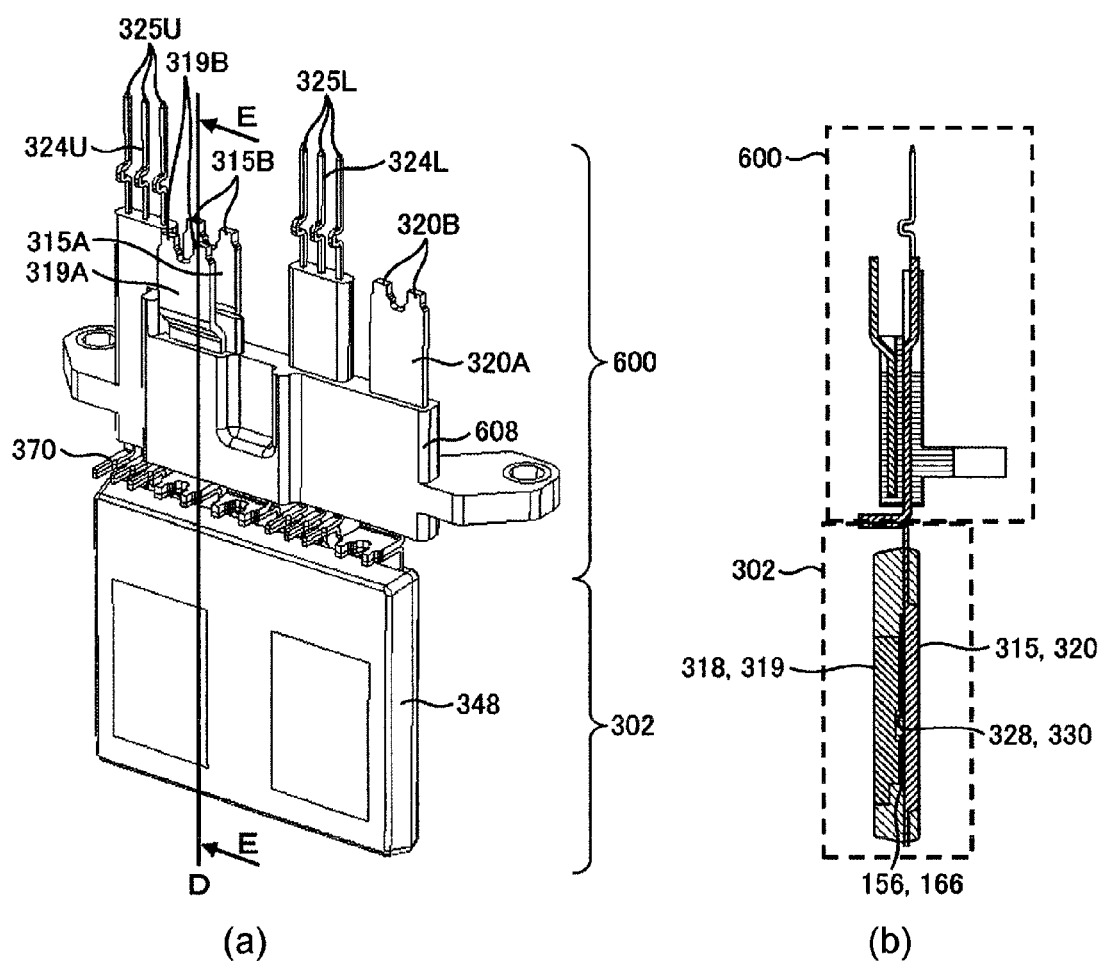
[FIG. 28]
Figure 29:
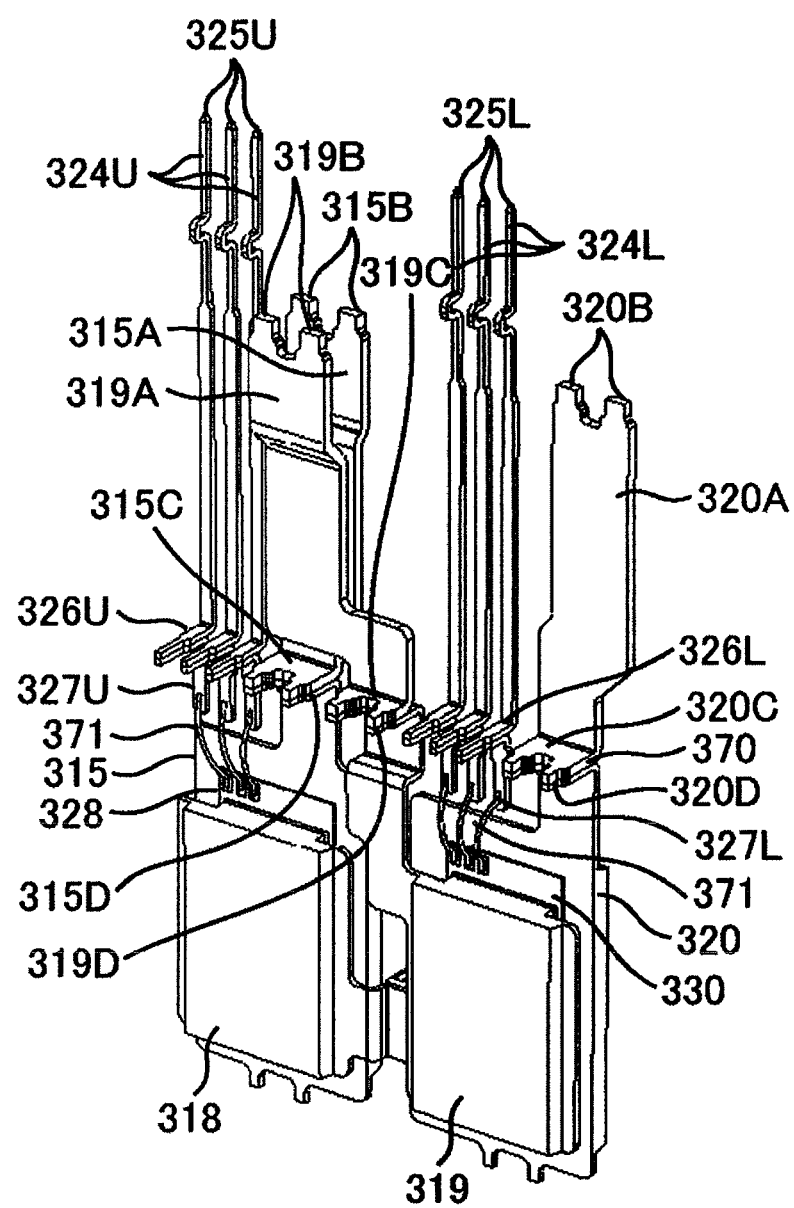
[FIG. 29]
Figure 30:
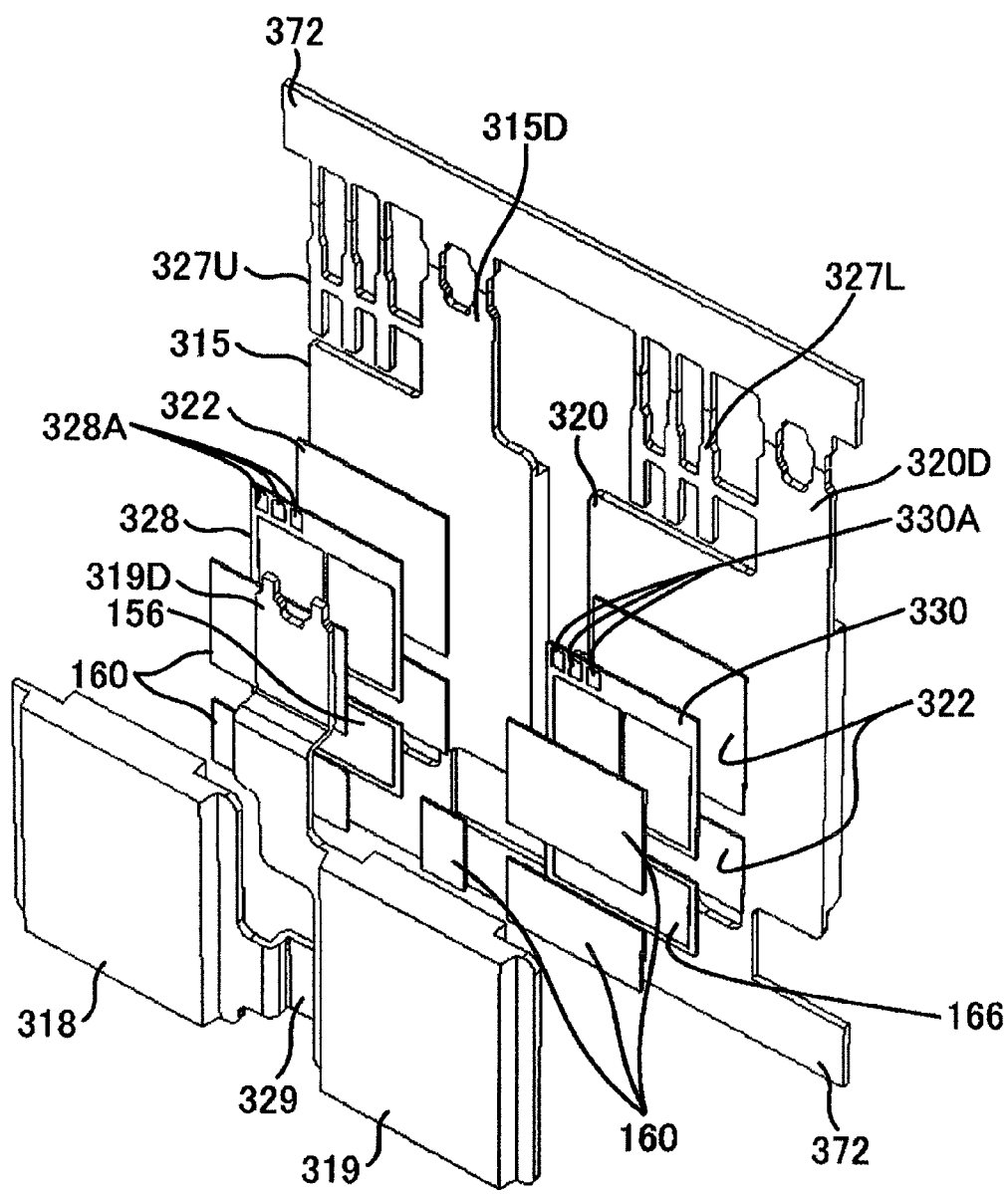
[FIG. 30]

FIG. 29 is a perspective view of the power semiconductor module 300U in FIG. 28 from which a first sealing resin 348 and a wiring insulation part 608 are further removed. FIG. 30 is a diagram illustrating the assembly process of a primary module sealed body 302. As illustrated in FIGS. 28 and 29, the power semiconductor element (the IGBTs 328 and 330 and the diodes 156 and 166) constituting the upper and lower arm series circuit 150 is held and fixed between conductor plates 315 and 318 or conductor plates 320 and 319. The conductor plate 315 and the like with an exposed heat dissipating surface is sealed by the first sealing resin 348 so that an insulating sheet 333 is bonded to the heat dissipating surface by thermal compression. The first sealing resin 348 has a polyhedral shape (a substantially rectangular parallelepiped shape in this case) as illustrated in FIG. 14.

The primary module sealed body 302 sealed by the first sealing resin 348 is inserted into the module case 304 and bonded to the inner surface thereof by thermal compression through the insulating sheet 333 in between, the module case 304 being a can-type cooler that is a cylindrical cooler with an insertion port 306 on one surface and a bottom on another surface. An air gap remaining inside the module case 304 is filled up by the second sealing resin 351.

The case 5 illustrated in the first to the fourth embodiments corresponds to the module case 304 in the present embodiment. In addition, the circuit body 100 illustrated in the first to the fourth embodiments corresponds to the primary module sealed body 302 in the present embodiment.

The module case 304 is formed of a member having electric conductivity such as an aluminum alloy (Al, AlSi, AlSiC, and Al—C) and molded in one piece with no joint. The insertion port 306 is the only opening provided in the module case 304, and an outer periphery of the insertion port 306 is surrounded by a flange 304B. As illustrated in FIG. 26(a), a first heat dissipating surface 307A and a second heat dissipating surface 307B that are larger than the other surface are disposed facing each other, while the respective power semiconductor elements (the IGBTs 328 and 330 and the diodes 156 and 166) are disposed to face these heat dissipating surfaces. Three surfaces joining the first heat dissipating surface 307A and the second heat dissipating surface 307B that face each other constitute a closed surface with the width narrower than the first heat dissipating surface 307A and the second heat dissipating surface 307B, so that the insertion port 306 is formed on the one remaining side. The module case 304 need not be an exact rectangular parallelepiped, whereby a corner may be rounded as illustrated in FIG. 26(a).

The module case 304 formed of metal in the aforementioned shape can be sealed against the cooling medium by means of the flange 304B when inserted into the passage 19 through which the cooling medium such as water or oil flows, whereby the simple structure can prevent the cooling medium from infiltrating into the module case 304. Moreover, the fin 305 is uniformly formed on each of the first heat dissipating surface 307A and the second heat dissipating surface 307B facing each other. Also formed on the outer periphery of the first heat dissipating surface 307A and the second heat dissipating surface 307B is a curvature 304A, the thickness of which is extremely decreased. The thickness of the curvature 304A is extremely decreased to the degree that it can be easily deformed by pressurizing the fin 305, thereby improving the productivity after the primary module sealed body 302 is inserted.

The insulating sheet 333 does not easily come off of the primary module sealed body 302 or the module case 304 by forming the deformed protrusion region illustrated in the first to the fourth embodiments in the curvature 304A. Especially when the outer surface of the module case 304 is directly cooled by the cooling medium as in the present embodiment, the heat dissipation from the outer surface of the module case 304 can be accelerated by reducing the thermal resistance in a heat transfer path from the power semiconductor element to the outer surface of the module case 304. As a result, the current flowing through the power semiconductor element can be increased while the cooling part in the power conversion device can be downsized, whereby the output current of the power conversion device per volume can be greatly increased.

The air gap between the conductor plate 315 or the like and the inner wall of the module case 304 can be reduced by bonding the conductor plate 315 or the like to the inner wall of the module case 304 by thermal compression through the insulating sheet 333, so that the heat generated by the power semiconductor element can be efficiently conveyed to the fin 305. Moreover, the insulating sheet 333 having the moderate thickness and flexibility can absorb thermal stress and is therefore favorable for use in the power conversion device of vehicle subjected to a drastic temperature change.

A DC positive wiring 315A and a DC negative wiring 319A formed of metal are provided outside the module case 304 to be electrically connected to the capacitor module 500, the DC positive wiring and the DC negative wiring including at the tip portion thereof the DC positive terminal 315B (157) and the DC negative terminal 319B (158), respectively. An AC wiring 320A formed of metal is also provided to supply AC power to the motor generator MG1, the AC wiring including at the tip thereof the AC terminal 320B (159). In the present embodiment, as illustrated in FIG. 29, the DC positive wiring 315A is connected to the conductor plate 315, the DC negative wiring 319A is connected to the conductor plate 319, and the AC wiring 320A is connected to the conductor plate 320.

Also provided outside the module case 304 is signal wirings 324U and 324L formed of metal to be electrically connected to the driver circuit 174, the signal wirings including at the tip thereof the signal terminal 325U (154, 155) and the signal terminal 325L (164, 165), respectively. In the present embodiment, as illustrated in FIG. 15, the signal wiring 324U is connected to the IGBT 328 whereas the signal wiring 324L is connected to the IGBT 328.

The DC positive wiring 315A, the DC negative wiring 319A, the AC wiring 320A, and the signal wirings 324U and 324L are integrally molded as an auxiliary mold body 600 while mutually insulated by the wiring insulation part 608 molded by a resin material. The wiring insulation part 608 also serves as a supporting member to support each wiring and is suitably formed of a thermosetting resin or a thermoplastic resin having insulating property. Accordingly, the DC positive wiring 315A, the DC negative wiring 319A, the AC wiring 320A, and the signal wirings 324U and 324L can be mutually insulated so that high-density wiring can be realized. The auxiliary mold body 600 is joined to the primary module sealed body 302 by metal joining at a connecting portion 370 and thereafter fixed to the module case 304 by the screw 309 passing through a screw hole provided in the wiring insulation part 608. The metal joining at the connecting portion 370 between the primary module sealed body 302 and the auxiliary mold body 600 can be performed by a TIG welding method, for example.

The DC positive wiring 315A and the DC negative wiring 319A are laminated while interposing the wiring insulation part 608 in between and extended substantially in parallel with each other. Such arrangement and the shape of the wirings allow the current momentarily flowing at the time of the switching operation by the power semiconductor element to flow in opposed relation to each other in opposite directions. The magnetic field created by the current is thus canceled out, achieving low inductance. Note that the AC wiring 320A and the signal terminals 325U and 325L also extend in the direction similar to that of the DC positive wiring 315A and the DC negative wiring 319A.

The connecting portion 370 at which the primary module sealed body 302 and the auxiliary mold body 600 are connected by metal joining is sealed in the module case 304 by the second sealing resin 351. As a result, an insulation distance required between the connecting portion 370 and the module case 304 can be stably secured so that the power semiconductor module 300U can be downsized as compared to when the connecting portion is not sealed.

As illustrated in FIG. 29, an auxiliary module side DC positive connection terminal 315C, an auxiliary module side DC negative connection terminal 319C, an auxiliary module side AC connection terminal 320C, an auxiliary module side signal connection terminal 326U, and an auxiliary module side signal connection terminal 326L are arranged in line on the auxiliary module 600 side of the connecting portion 370. On the other hand, an element side DC positive connection terminal 315D, an element side DC negative connection terminal 319D, an element side AC connection terminal 320D, an element side signal connection terminal 327U, and an element side signal connection terminal 327L are arranged in line along one surface of the polyhedral first sealing resin 348 on the primary module sealed body 302 side of the connecting portion 370. The primary module sealed body 302 can therefore be manufactured easily by a transfer mold by arranging each terminal in line at the connecting portion 370.

Now, a positional relationship among the respective terminals will be described, where the terminals extending out from the first sealing resin 348 of the primary module sealed body 302 are counted by type. That is, the terminal including the DC positive wiring 315A (including the DC positive terminal 315B and the auxiliary module side DC positive connection terminal 315C) and the element side DC positive connection terminal 315D are referred to as a positive terminal, the terminal including the DC negative wiring 319A (including the DC negative terminal 319B and the auxiliary module side DC negative connection terminal 319O) and the element side DC negative connection terminal 315D are referred to as a negative terminal, the terminal including the AC wiring 320A (including the AC terminal 320B and the auxiliary module side AC connection terminal 320C) and the element side AC connection terminal 320D are referred to as an output terminal, the terminal including the signal wiring 324U (including the signal terminal 325U and the auxiliary module side signal connection terminal 326U) and the element side signal connection terminal 327U are referred to as an upper arm signal terminal, and the terminal including the signal wiring 324L (including the signal terminal 325L and the auxiliary module side signal connection terminal 326L) and the element side signal connection terminal 327L are referred to as a lower arm signal terminal.

Each of the aforementioned terminals is projected out of the first sealing resin 348 and the second sealing resin 351 through the connecting portion 370. Each portion projected out of the first sealing resin 348 (namely the element side DC positive connection terminal 315D, the element side DC negative connection terminal 319D, the element side AC connection terminal 320D, the element side signal connection terminal 327U, and the element side signal connection terminal 327L) is arranged in line along one surface of the polyhedral first sealing resin 348. The positive terminal and the negative terminal are projected out of the second sealing resin 351 while laminated and extend outside the module case 304. As a result, when sealing the power semiconductor element by the first sealing resin 348 and mold closing the primary module sealed body 302, there can be no excessive stress applied to the connecting portion between the power semiconductor element and the terminal or no gap created in the mold. Furthermore, the current flowing through each of the laminated positive terminal and the negative terminal in the opposite direction generates a magnetic flux that cancels each other out, thereby achieving low inductance.

On the auxiliary module 600 side, the auxiliary module side DC positive connection terminal 315C and the auxiliary module side DC negative connection terminal 319C are formed at the tip of the DC positive wiring 315A and the DC negative wiring 319A, respectively, on the opposite side of the DC positive terminal 315B and the DC negative terminal 319B. The auxiliary module side AC connection terminal 320C is formed at the tip of the AC wiring 320A on the opposite side of the AC terminal 320B. The auxiliary module side signal connection terminals 326U and 326L are formed at the tip of the signal wirings 324U and 324L, respectively, on the opposite side of the signal terminals 325U and 325L.

On the primary module sealed body 302 side, the element side DC positive connection terminal 315D, the element side DC negative connection terminal 319D, and the element side AC connection terminal 320D are formed on the conductor plates 315, 319, and 320, respectively. The element side signal connection terminals 327U and 327L are connected to the IGBTs 328 and 330, respectively, via a bonding wire 371.

Figure 31:
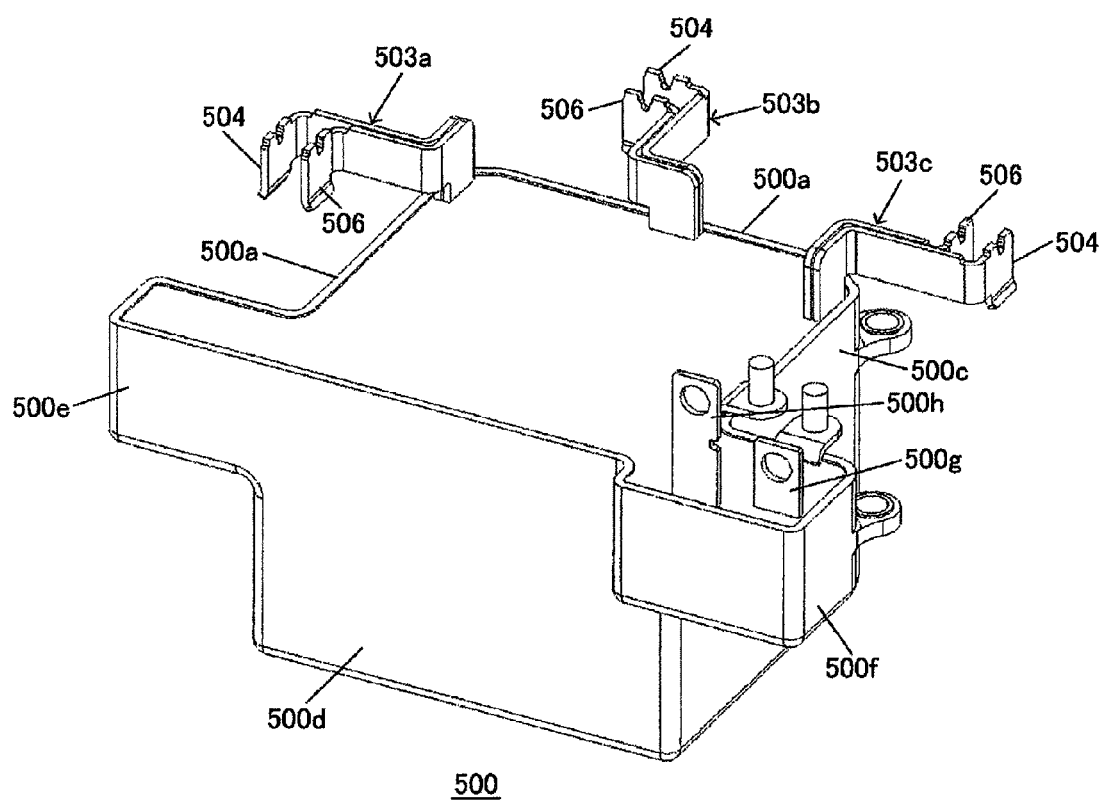
[FIG. 31]

FIG. 31 is an exterior perspective view of the capacitor module 500. A plurality of capacitor cells is provided in the capacitor module 500. Capacitor terminals 503a to 503c are projected at the top surface of the capacitor module 500 while neighboring the surface of the capacitor module 500 facing the passage 19. The capacitor terminals 503a to 503c are formed corresponding to the positive terminal 157 and the negative terminal 158 of each power semiconductor module 300. Moreover, the capacitor terminals 503a and 503c have the identical structure where an insulating sheet is provided between a negative capacitor terminal 504 and a positive capacitor terminal 506 that are included in each of the capacitor terminals 503a to 503c, the insulating sheet securing insulation between the terminals.

Projections 500e and 500f are formed at the top part of the capacitor module 500 on the side surface 500d side. A discharge resistor is mounted in the projection 500e, whereas a Y-capacitor for rejecting common mode noise is mounted in the projection 500f. Moreover, the power supply terminals 508 and 509 illustrated in FIG. 5 are connected to terminals 500g and 500h that are projected from the top surface of the projection 500f. As illustrated in FIG. 24, recesses 405a and 405b are formed between the openings 402b and 402c and the side surface 12d, so that the projection 500e is housed in the recess 405a and the projection 500f is housed in the recess 405b when housing the capacitor module 500 in the housing space 405 of the passage forming body 12.

The discharge resistor mounted in the projection 500e discharges an electrical charge built up in the capacitor cell of the capacitor module 500 when the inverter is stopped. The recess 405a in which the projection 500e is housed is provided directly above the passage of the cooling medium flowing in from the inlet pipe 13 so that the temperature rise in the discharge resistor at the time of discharging can be suppressed.

Figure 32:
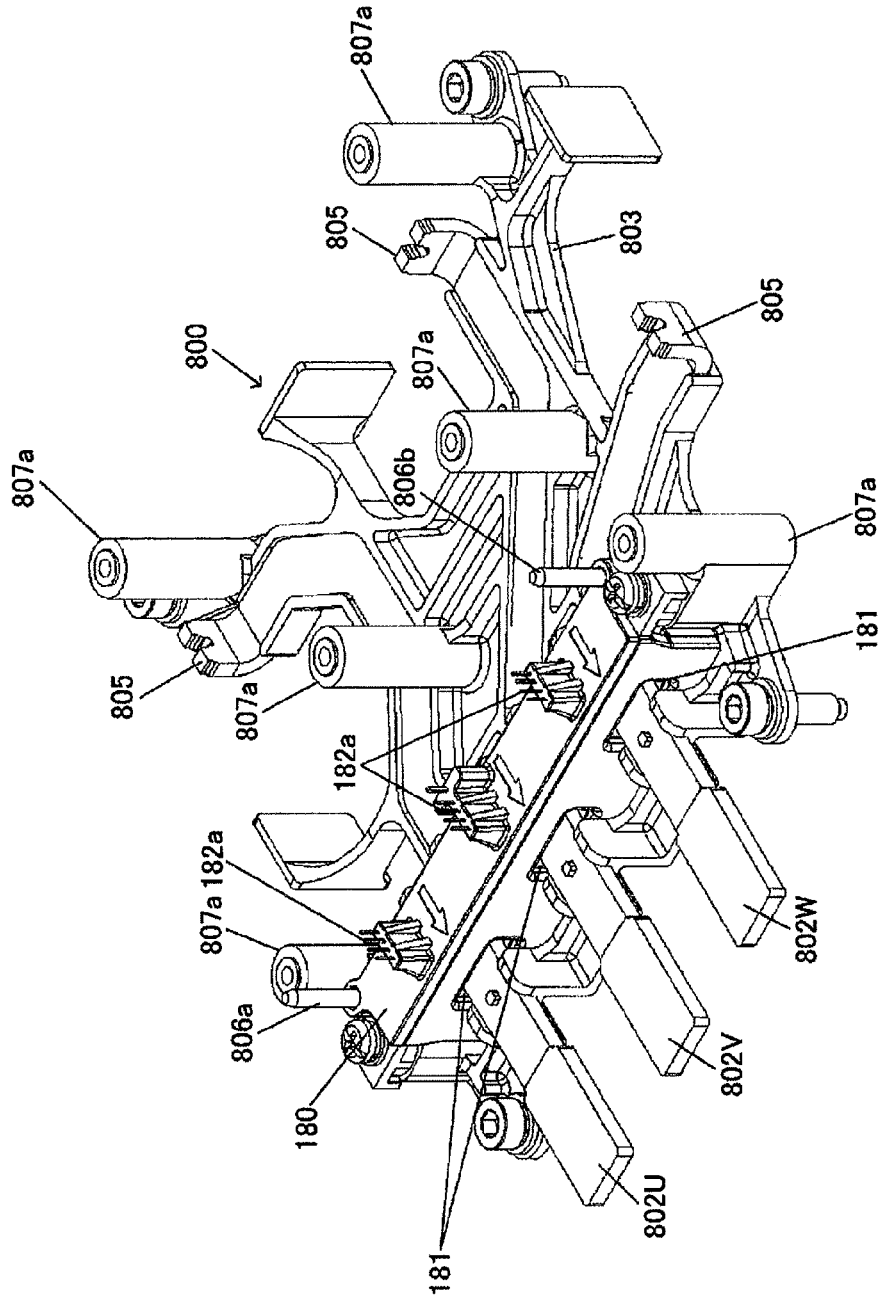
[FIG. 32]

FIG. 32 is a perspective view of the busbar assembly 800. The busbar assembly 800 includes: the AC busbars 802U, 802V, and 802W for the U, the V, and the W phases; a holding member 803 which holds and fixes the AC busbars 802U to 802W; and the current sensor 180 which detects an alternating current flowing through the AC busbars 802U to 802W. Each of the AC busbars 802U to 802W is formed of a wide conductor. A plurality of supporting members 807a for holding the driver circuit board 22 is formed in the holding member 803 and projected upward therefrom, the holding member 803 being formed of an insulating material such as resin.

Figure 22:
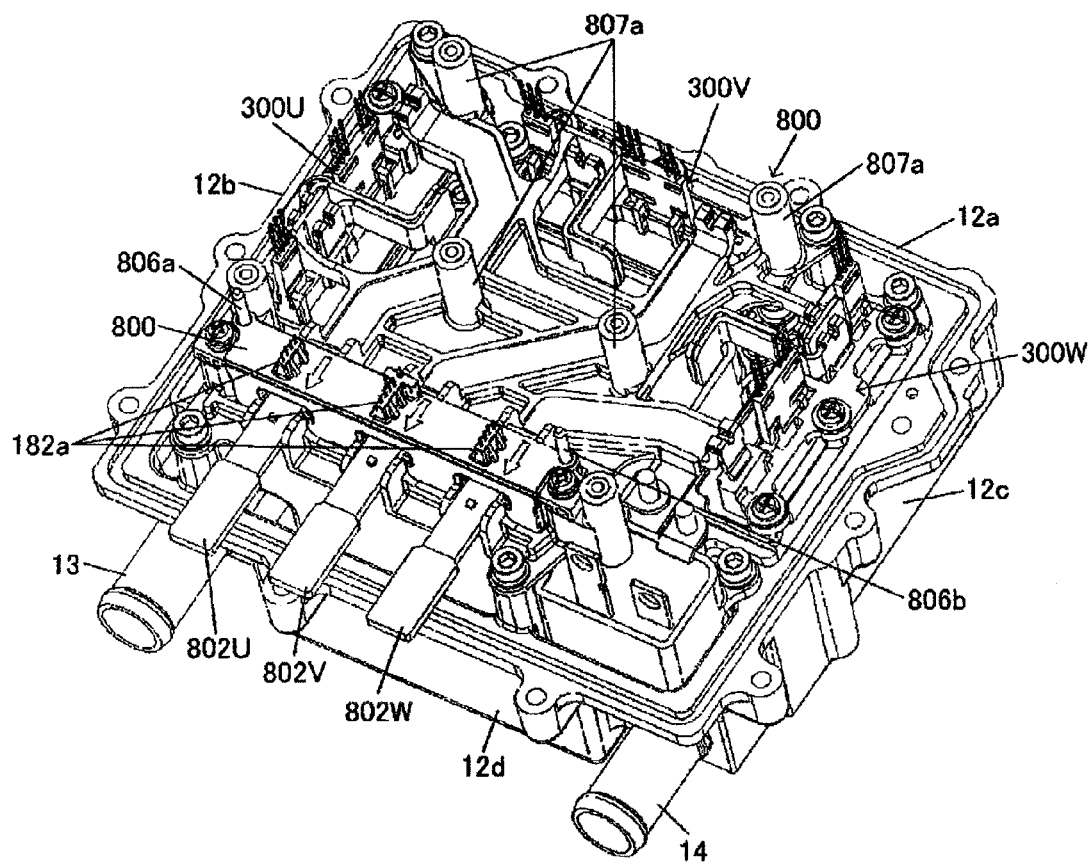
[FIG. 22]

The current sensor 180 is arranged in the busbar assembly 800 to be parallel with/come close to the side surface 12d of the passage forming body 12 when the busbar assembly 800 is fixed to the passage forming body 12 as illustrated in FIG. 22. A through hole 181 which each of the AC busbars 802U to 802W passes through is formed on the side surface of the current sensor 180. A sensor element is provided in a portion where the through hole 181 of the current sensor 180 is formed, and a signal line 182a of each sensor element is projected out from the top surface of the current sensor 180. Each sensor element is arranged side by side in the direction to which the current sensor 180 extends, namely, to which the side surface 12d of the passage forming body 12 extends. The tip of the AC busbars 802U to 802W is projected in parallel with one another while passing through each through hole 181.

As illustrated in FIG. 32, positioning projections 806a and 806b are formed in the holding member 803 and projected upward. When fixed to the holding member 803 by a fastening screw, the current sensor 180 is positioned by engaging the projections 806a and 806b with a positioning hole formed in the frame of the current sensor 180. When the driver circuit board 22 is fixed to the supporting member 807a, the signal line 182a of the current sensor 180 is positioned to a through hole in the driver circuit board 22 by engaging a positioning hole formed in the driver circuit board 22 side with the positioning projections 806a and 806b. The signal line 182a is then soldered to a wiring pattern of the driver circuit board 22.

The holding member 803, the supporting member 807a, and the projections 806a and 806b in the present embodiment are integrally formed by resin. Moreover, the holding member 803 having the function to position the current sensor 180 and the driver circuit board 22 as described above can facilitate the assembling and soldering work between the signal line 182a and the driver circuit board 22. The number of components required for the power conversion device as a whole can also be decreased by holding the current sensor 180 and the driver circuit board 22 by the mechanism provided in the holding member 803.

The AC busbars 802U to 802W are fixed to the holding member 803 such that the wider surface of the busbar is positioned horizontally, while a connecting portion 805 to be connected to the AC terminal 159 of the power semiconductor modules 300U to 300W is erected vertically. The tip of the connecting portion 805 has an irregular shape such that heat is concentrated at the irregular portion at the time of welding.

Each of the AC busbars 802U to 802W projected out through the through hole 181 of the current sensor 180 is arranged on the side surface 12d of the passage forming body 12 because, as described above, the current sensor 180 is arranged in parallel with the side surface 12d of the passage forming body 12. The respective power semiconductor modules 300U to 300W are arranged in the passage sections 19a to 19c formed along the side surfaces 12a to 12c of the passage forming body 12, so that the connecting portion 805 of the AC busbars 802U to 802W is arranged at a position corresponding to the side surfaces 12a to 12c of the busbar assembly 800. As a result, as illustrated in FIG. 22, the U-phase AC busbar 802U runs from the power semiconductor module 300U arranged in the vicinity of the side surface 12b to the side surface 12d, the V-phase AC busbar 802V runs from the power semiconductor module 300V arranged in the vicinity of the side surface 12a to the side surface 12d, and the W-phase AC busbar 802W runs from the power semiconductor module 300W arranged in the vicinity of the side surface 12c to the side surface 12d.

Figure 33:
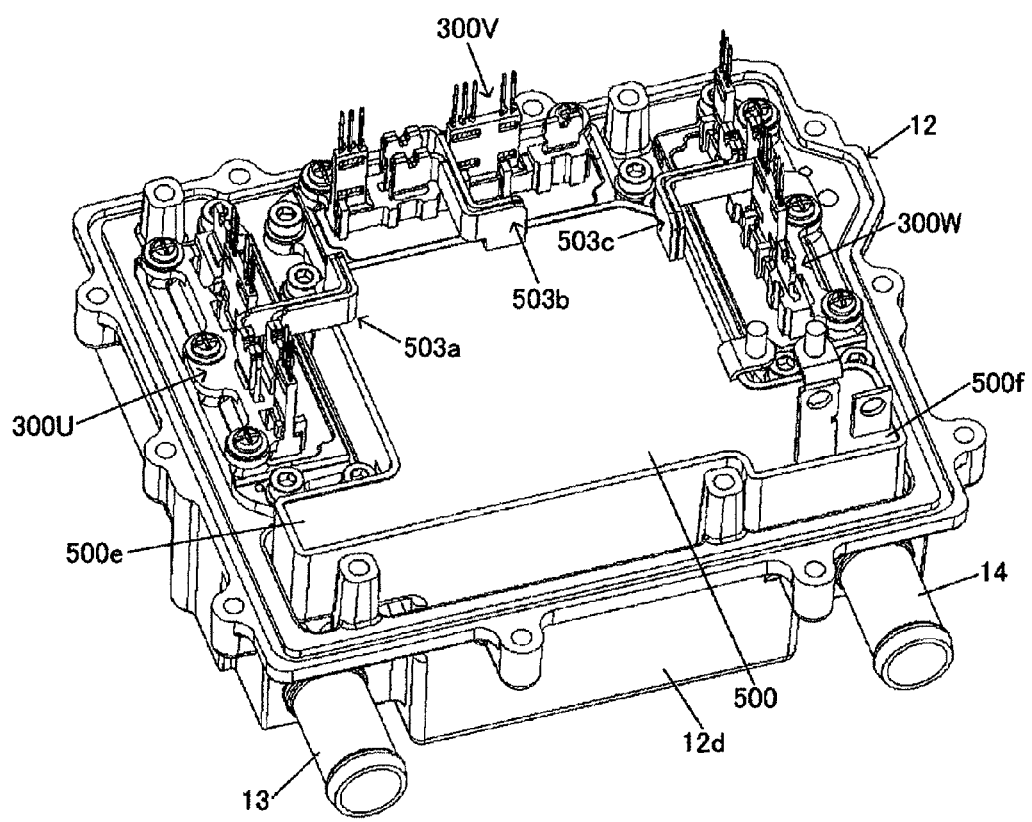
[FIG. 33]

FIG. 33 is a diagram illustrating the passage forming body 12 in which the power semiconductor modules 300U to 300W are fixed in the openings 402a to 402c, and the capacitor module 500 is housed in the housing space 405. In the example illustrated in FIG. 33, the U-phase power semiconductor module 300U is fixed in the opening 402b, the V-phase power semiconductor module 300V is fixed in the opening 402a, and the W-phase power semiconductor module 300W is fixed in the opening 402c. The capacitor module 500 is thereafter housed in the housing space 405, followed by the welding work or the like to connect the terminal on the capacitor side with the terminal of each of the power semiconductor modules. Each terminal is projected out of the upper end surface of the passage forming body 12 so that a welding machine approaches the terminal from above to perform the welding work.

Here, the DC positive terminal 315B and the DC negative terminal 319B of each of the power semiconductor modules 300U to 300W arranged in the U-shape are connected to the capacitor terminals 503a to 503c that are projected out on the top surface of the capacitor module 500 as illustrated in FIG. 31. The three power semiconductor modules 300U to 300W are provided while surrounding the capacitor module 500 so that the positional relationship between the capacitor module 500 and each of the power semiconductor modules 300U to 300W is equal and that each power semiconductor module can be connected to the capacitor module 500 in a balanced manner by using the capacitor terminals 503a to 503c having the same shape. Accordingly, a circuit constant of the capacitor module 500 and the power semiconductor modules 300U to 300W can be more easily balanced among each of the three phases, thereby allowing the current to flow in and out easily.

The aforementioned description has been provided merely as an example, and the present invention is not to be limited to the structure of the aforementioned embodiments. Other aspects conceivable within the scope of the technical principles of the present invention will be included within the scope of the present invention.

The disclosure of the following priority application is herein incorporated by reference: Japanese Patent Application No. 2011-041112 (filed on Feb. 28, 2011).

The invention claimed is:

1. A power semiconductor module comprising:
    a circuit body including:
        a power semiconductor element; and
        a conductor member connected to the power semiconductor element;
    a case in which the circuit body is housed, the case including:
        a first heat dissipating member and a second heat dissipating member which are disposed in opposed relation to each other while interposing the circuit body in between;
        a side wall which joins the first heat dissipating member and the second heat dissipating member; and
        an intermediate member which is formed on a periphery of the first heat dissipating member and connected to the side wall, the intermediate member including a curvature that is projected toward a housing space of the case; and
    a joint member which connects the circuit body and the case.

2. The power semiconductor module according to claim 1, wherein, when a connecting portion between the side wall and the intermediate member is defined as a first connecting portion while a connecting portion between the first heat dissipating member and the intermediate member is defined as a second connecting portion, a protrusion formed in the intermediate member is projected toward a side where the circuit body is disposed relative to a position of a line segment connecting the first connecting portion and the second connecting portion.

3. The power semiconductor module according to claim 2, wherein an apex of the protrusion is formed at a midpoint of the line segment connecting the first connecting portion and the second connecting portion.

4. The power semiconductor module according to claim 2, wherein the apex of the protrusion is formed closer to the first connecting portion than the midpoint of the line segment connecting the first connecting portion and the second connecting portion.

5. The power semiconductor module according to claim 2, wherein the apex of the protrusion is formed closer to the second connecting portion than the midpoint of the line segment connecting the first connecting portion and the second connecting portion.

6. The power semiconductor module according to claim 2, wherein the second connecting portion is a corner of the first heat dissipating member, and
the first connecting portion is a corner of the intermediate member.

7. The power semiconductor module according to claim 6, wherein, when projected from a heat dissipating surface of the first heat dissipating member, a projected part of the protrusion formed in the intermediate member has a shape that is bent along two adjacent sides of the first heat dissipating member which form a corner of the second connecting portion.

8. The power semiconductor module according to claim 1, wherein the curvature in the intermediate member is plastically deformed.

9. A method of manufacturing a power semiconductor module, the power semiconductor module including:
a circuit body including:
a semiconductor element; and
a conductor plate connected to an electrode plane of the semiconductor element through solder; and
a metal case including:
a first heat dissipating plate facing one surface of the circuit body;
a second heat dissipating plate facing another surface of the circuit body opposite to the one surface thereof; and
an intermediate member which connects the first heat dissipating plate and the second heat dissipating plate and includes an opening into which the circuit body is inserted,
the method comprising:
a first step of inserting the circuit body from the opening of the case;
a second step of deforming a part of the intermediate member of the case while holding the circuit body between the first heat dissipating plate and the second heat dissipating plate;
a third step of further deforming a part of the intermediate member of the case; and
a fourth step of performing high-temperature treatment on the case and the circuit body.

10. The method of manufacturing a power semiconductor module according to claim 9,
wherein the power semiconductor module includes an insulating sheet which joins at least one of the first heat dissipating plate and the second heat dissipating plate with the circuit body, and
an adhesive force of the sheet is increased by the high-temperature treatment performed in the fourth step.

11. A power conversion device comprising:
a power semiconductor module including:
a power semiconductor element which converts DC current into AC current;
a circuit body having a conductor member connected to the power semiconductor element;
a case in which the circuit body is housed; and
a joint member which connects the circuit body and the case; and
a passage forming body which forms a passage through which a cooling medium that cools the power semiconductor element flows,
wherein the case includes:
a first heat dissipating member and a second heat dissipating member which are disposed in opposed relation to each other while interposing the circuit body in between;
a side wall which joins the first heat dissipating member and the second heat dissipating member; and
an intermediate member which is formed on a periphery of the first heat dissipating member and connected to the side wall, the intermediate member including a curvature that is projected toward a housing space of the case, and
the case is fixed to the passage forming body in order for the first heat dissipating member and the second heat dissipating member to be in direct contact with the cooling medium.

12. The power semiconductor module according to claim 1, wherein the first heat dissipating member and the intermediate member are formed when a part corresponding to the first heat dissipating member on a flat planar member of the case is pressed toward the housing space of the case.

* * * * *